(12) United States Patent
Endo et al.

(10) Patent No.: US 7,944,200 B2
(45) Date of Patent: May 17, 2011

(54) PROBE APPARATUS

(75) Inventors: Tomoya Endo, Nirasaki (JP); Hiroshi Yamada, Nirasaki (JP); Kazumi Yamagata, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 66 days.

(21) Appl. No.: 12/564,381

(22) Filed: Sep. 22, 2009

(65) Prior Publication Data
US 2010/0079161 A1  Apr. 1, 2010

(30) Foreign Application Priority Data

Sep. 22, 2008 (JP) ................. 2008-242950

(51) Int. Cl.
*G01R 31/28* (2006.01)
*G01R 31/02* (2006.01)
(52) U.S. Cl. ..................... 324/158.1; 324/754
(58) Field of Classification Search .......... None
See application file for complete search history.

(56) References Cited

U.S. PATENT DOCUMENTS 7,301,326 B1 * 11/2007 Green et al. ............... 324/158.1

FOREIGN PATENT DOCUMENTS

| JP | 1-272982 | 10/1989 |
| JP | 2-177343 | 7/1990 |
| JP | 3-22546 | 1/1991 |
| JP | 10-50778 | 2/1998 |

* cited by examiner

*Primary Examiner* — Roberto Velez
(74) *Attorney, Agent, or Firm* — Oblon, Spivak, McClelland, Maier & Neustadt, L.L.P.

(57) ABSTRACT

A probe apparatus includes a holding frame holding a test head through a biasing unit biasing the test head. An annular member is rotatably mounted in an opening of a ceiling plate of a main body. Cam followers are rotatably provided circumferentially on the annular member. An intermediate connecting member is provided in a lower surface of the test head, for bringing the test head into electrical contact with an upper surface of the probe card. Protrusions for guiding the cam followers are provided corresponding thereto at an outer periphery of the intermediate connecting member, upper surfaces of the protrusions being inclined. The cam followers are moved relatively upward along the respective inclined surfaces of the protrusions by rotating the annular member so that the intermediate connecting member is pushed downward against a biasing force of the biasing unit to bring the test head into press-contact with the probe card.

11 Claims, 23 Drawing Sheets

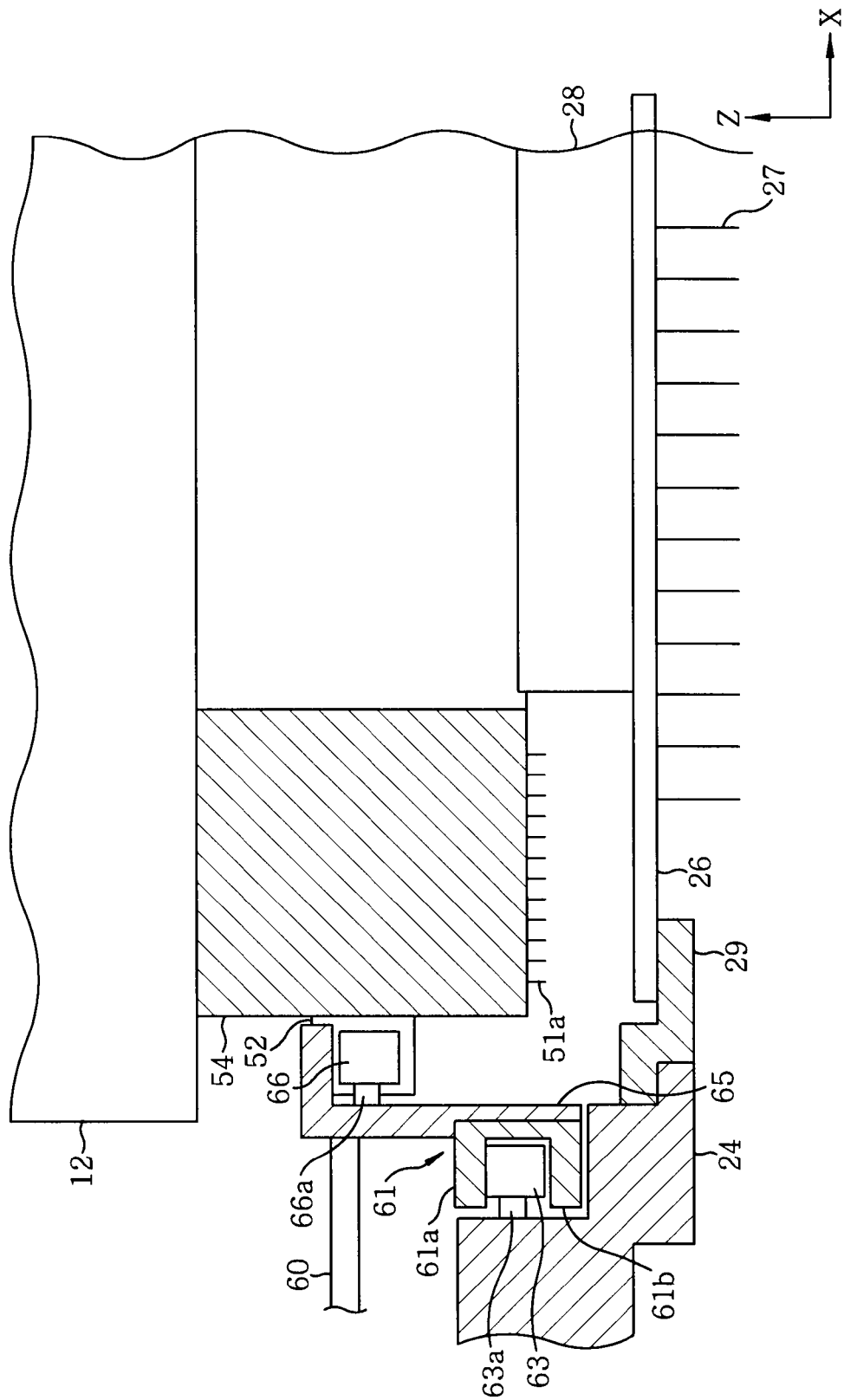

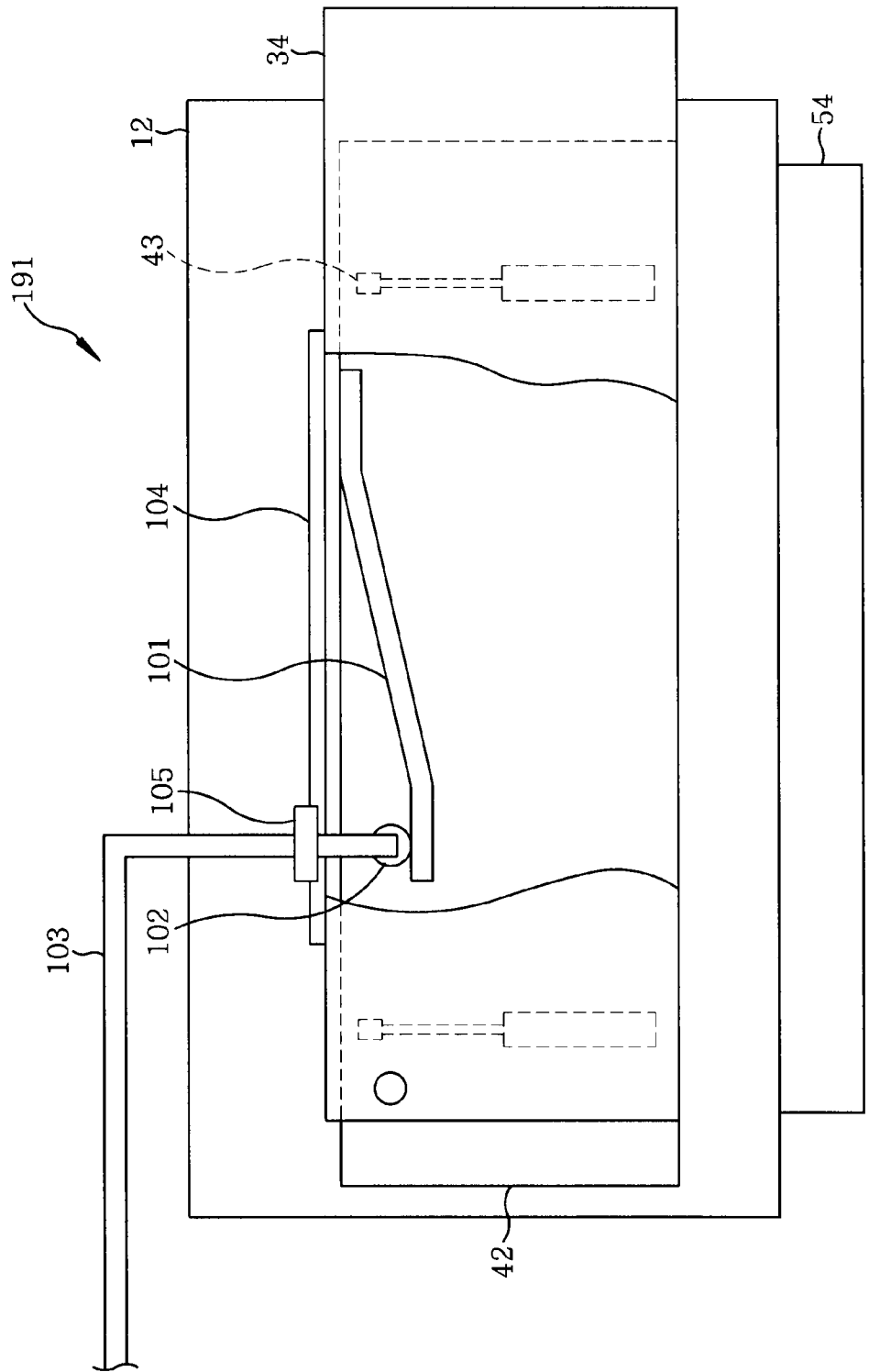

PROBE APPARATUS

CROSS-REFERENCE TO RELATED APPLICATIONS

This application claims priority to Japanese Patent Application No. 2008-242950 filed on Sep. 22, 2008, the entire contents of which are incorporated herein by reference.

FIELD OF THE INVENTION

The present invention relates to a probe apparatus which measures electric characteristics of a substrate by bringing probes into contact with electrode pads of the substrate; and more particularly, to a technique for mounting a test head to a ceiling plate of a main body of a probe apparatus.

BACKGROUND OF THE INVENTION

In the manufacturing process of a semiconductor device, the quality of the device is determined by testing an electric characteristic of each integrated circuit chip of a wafer after the chips are completed. Such a test is performed by a test apparatus called a probe apparatus including: a main body in which a mounting table for mounting, e.g., a semiconductor wafer is provided; a probe card installed in a head plate (ceiling plate) of the main body and having probes provided at its bottom surface, the probes being brought into contact with electrode pads of a chip; and a box-shaped test head provided above the probe card and connected to the probe card via a pogo ring having pogo pins in its top and bottom surfaces.

In a typical structure for installing the test head, a pivot mechanism having a rotation shaft, which is rotatable about a horizontal axis, is provided at a side of the main body of the probe apparatus and the test head is supported at its side by an arm extending from the rotation shaft. The test head is pivotable from a horizontal position toward its back surface at an upper side of the probe apparatus.

Since the probes of the probe card are arranged according to the electric pads of chips, it is required to exchange the probe card depending on kinds of wafers to be tested. Accordingly, there has been suggested a structure in which the probe card is held by a card holder and an elevation mechanism is provided to move the card holder upward and downward. When a wafer is tested, the probe card is moved upward to press the pogo ring of the test head. When the probe card is exchanged, the probe card is moved downward and separated from the pogo ring and then the probe card is drawn out from an outer side of the main body by sliding the card holder aside. When the probe card is exchanged, the test head remains its horizontal posture. However, in the maintenance, the test head is pivoted and separated from the head plate. When the maintenance is finished, the test head returns to the horizontal posture.

A regular load is required to make sure the electrical contact between the pogo ring and the probe card. To apply the load, it is necessary to push the test head relatively downward (or to push the probe card relatively upward) by, e.g. about 2 mm after the test head is brought into contact with the probe card. However, it is very difficult and unrealistic to move the heavy test head downward by such a fine amount by using a mechanism provided for the test head. Accordingly, as described above, the elevation mechanism is provided at the card holder to acquire the fine elevation amount.

The above probe apparatus, however, requires the mechanisms for sliding the card holder aside and moving the card holder upward and downward, which increases the cost of the probe apparatus. Alternatively, when the test head is separated from the head plate, an operator may exchange the probe card to the upper surface of the head plate. In this case, since it is necessary to accurately move the card holder upward by a fine amount in a state where the card holder is mounted to the head plate, a complex elevation mechanism is needed.

Such test apparatuses have been disclosed in, e.g., Japanese Patent Laid-open Applications Nos. H03-022546 and H02-177343. Further, e.g., Japanese Patent Laid-open Applications Nos. H01-272982 (FIG. 1) and H10-050778 (FIG. 2)), disclose mechanisms for accurately aligning the positions of the test head and the wafer or for horizontally holding the test head. However, any consideration related to the aforementioned issue is not reflected to the above patent documents.

SUMMARY OF THE INVENTION

In view of the above, the present invention provides a probe apparatus that can simply, inexpensively test a substrate with high accuracy.

In accordance with an aspect of the present invention, there is provided a probe apparatus for testing electrical characteristics of a target chip of a substrate by bringing probes formed on a lower surface of a probe card into contact with electrical pads of the target chip, in which the probe card is mounted in an opening formed in a ceiling plate of a main body of the apparatus and a test head is arranged above the probe card, the apparatus comprising: a pivot mechanism for pivoting the test head, about its horizontal rotary shaft, between a horizontal position at which a lower surface of the test head is horizontally located above the probe card and a separated position at which the test head is separated from the ceiling plate of the main body; a holding frame connected to the rotary shaft and holding the test head through a biasing unit biasing the test head when the test head is horizontally located; a annular member rotatably mounted in a peripheral portion of the opening in its circumferential direction; cam followers provided at the annular member along its circumferential direction to be rotatable about their horizontal axes extending toward a rotational center of the annular member; an intermediate connecting member provided in a lower surface of the test head, for bringing the test head into electrical contact with an upper surface of the probe card; and protrusions provided corresponding to the cam followers at an outer periphery of the intermediate connecting member in its circumferential direction, the protrusions serving as guideways for guiding the cam followers when the test head is horizontally located, upper surfaces of the protrusions being inclined along a circle concentric with the annular member. The cam followers are moved relatively upward along the respective inclined surfaces of the guideways by rotating the annular member so that the intermediate connecting member is pushed downward against a biasing force of the biasing unit to bring the test head into press-contact with the probe card.

BRIEF DESCRIPTION OF THE DRAWINGS

The objects and features of the present invention will become apparent from the following description of embodiments, given in conjunction with the accompanying drawings, in which:

FIG. 7 is an enlarged vertically cross sectional view showing the pogo ring shown in FIG. 5;

FIG. 19 is a vertically cross sectional view showing a probe apparatus in accordance with a third embodiment of the present invention;

DETAILED DESCRIPTION OF THE EMBODIMENT

A probe apparatus in accordance with a first embodiment of the present invention will be described with FIGS. 1 to 7. The probe apparatus includes a main body 11, a test head 12, and a loader unit 13 provided adjacent to the main body 11. Hereinafter, the arrangement direction of the main body 11 and the loader unit 13 is defined as a left-light direction and the lower and the upper side in FIG. 2 are defined as a front side and a back side, respectively.

Figure 1:
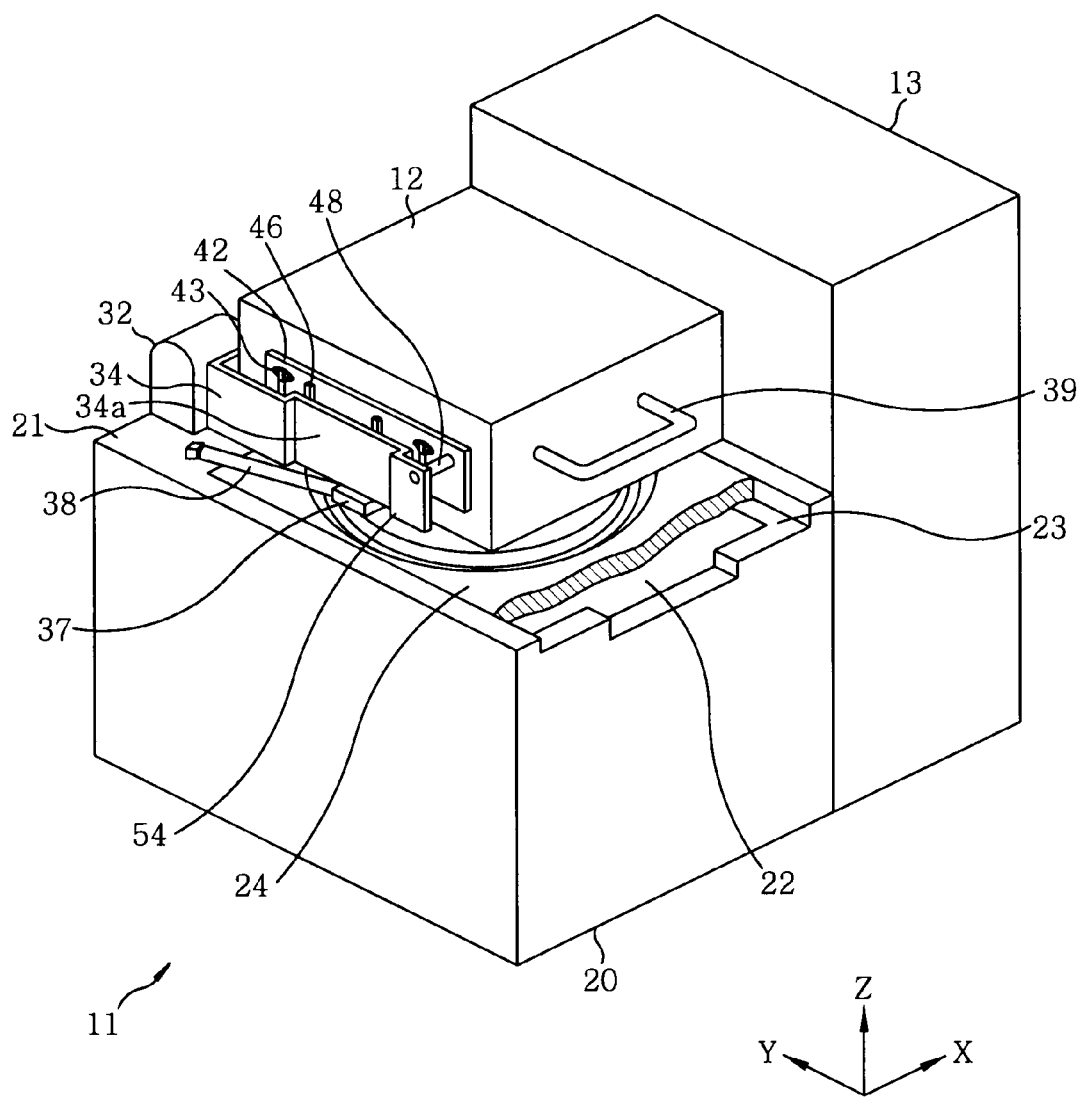
FIG. 1 is a perspective view showing a probe apparatus in accordance with a first embodiment of the present invention.

The main body 11 includes an exterior housing 20. As shown in FIG. 1, an opening 22 having, e.g., a rectangular shape is formed in a ceiling plate 21 of the housing 20. A rectangular head plate 24 is provided to cover the opening 22. In the ceiling plate 21, a guide mechanism 23 extending front and back is formed at, e.g., a lower edge side such that the head plate 24 is mountable and detachable with respect to the main body 11 by sliding front and back. An upper surface of the head plate 24 is flush with an upper surface of the ceiling plate 21. Further, a front upper surface of the housing 20 is cut out in a rectangular shape to prevent the housing 20 from colliding with the head plate when the head plate 24 is mounted and detached. Especially, a central portion of the front upper surface of the housing 20 is further cut out in a lower direction to prevent interference with probe needles 27, which will be described below.

When the head plate 24 is mounted to the main body 11, the head plate 24 is fixably joined to the main body 11 by, e.g., volts (not shown) or the like. The head plate 24 is shown in FIG. 1 with a portion thereof cut out.

Figure 2:
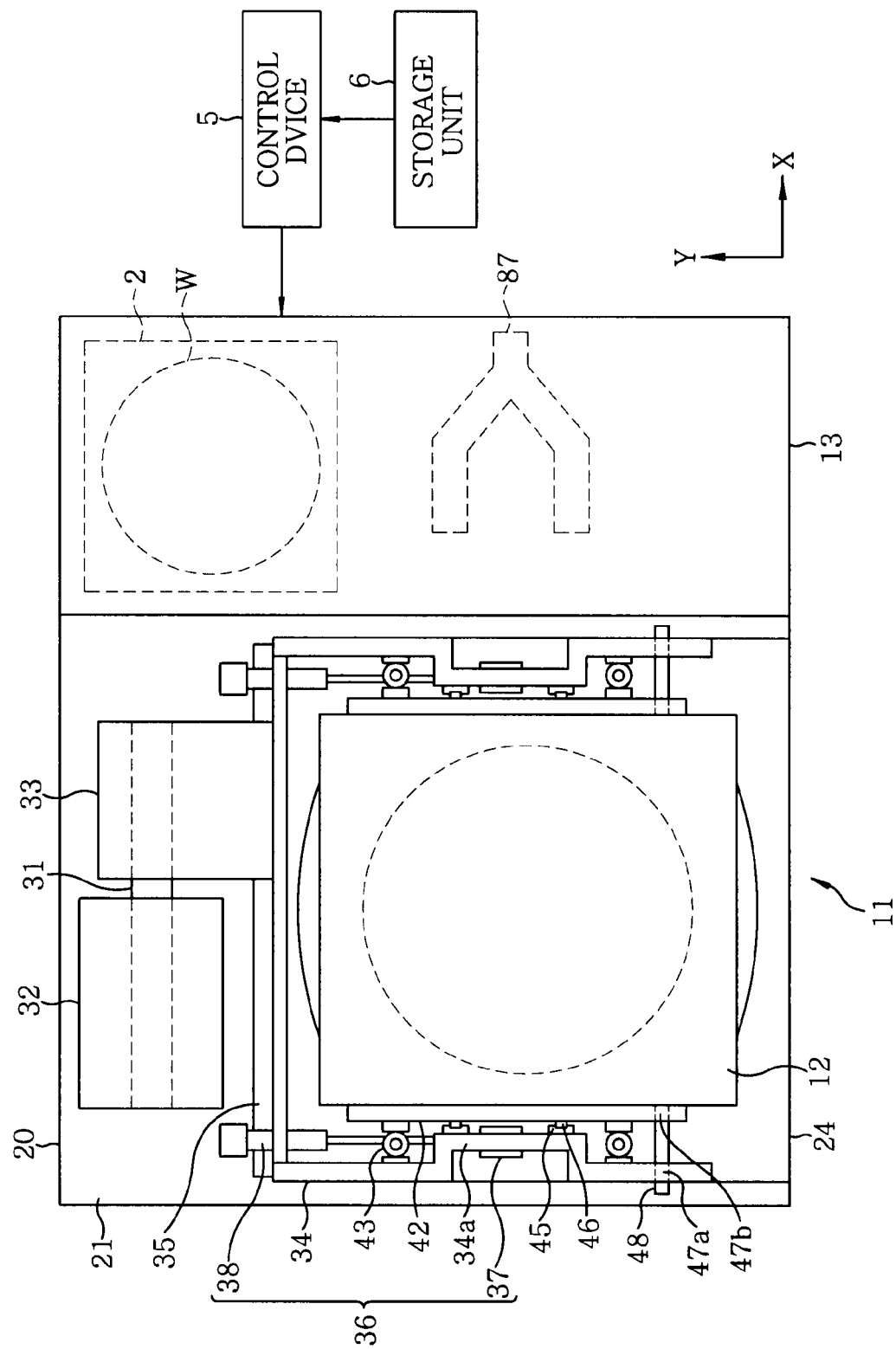
FIG. 2 is a plan view showing the probe apparatus shown in FIG. 1.

As shown in FIGS. 1 and 2, a box-shaped test head 12 having a weight of, e.g., about 60 kg is provided above the head plate 24. The test head 12 is held in its opposite sides by a holding frame 35 having an approximately C-shape (i.e., a rectangular shape with one side open). A hinge mechanism 32, which is a pivot mechanism, is provided at a left side of a back edge portion of the ceiling plate 21 (a left side of an X-direction in FIG. 1). A back side of the holding frame 35 is connected to a rotary shaft 31 of the hinge mechanism 32 via a plate-shaped rotation arm 33. Accordingly, the holding frame 35 is rotated by the rotary shaft 31. Thus, the test head 12 is pivotable between an inclinedly separated position at which the test head 12 is pivoted upward and separated from the head plate 24 and a horizontal position at which the test head 12 is horizontally disposed to face the head plate 24. A rotational center of the rotary shaft 31 is located at a position that is, e.g., about 140 mm higher than that of an upper surface of the ceiling plate 21.

Figure 3:
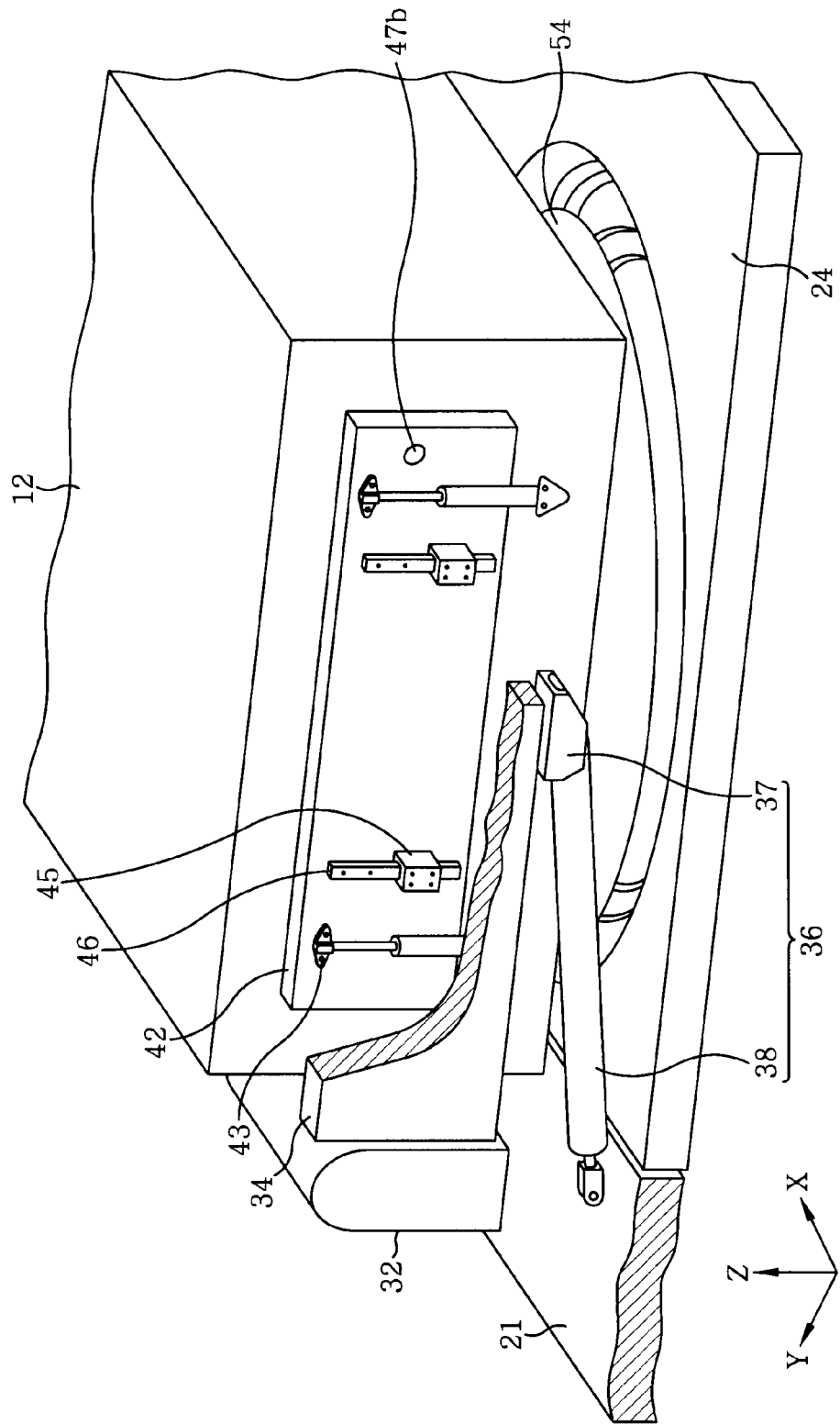
FIG. 3 is an enlarged perspective view showing a test head of the probe apparatus shown in FIG. 1.

Reinforcement plates 42 are attached to opposite side surfaces of the test head 12. As shown in FIG. 3, the test head 12 is held by the holding frame 35 through two pairs of gas springs 43 serving as biasing units, each pair of which is provided spaced apart from each other in the front-back direction between the reinforcement plate 42 and the arm 34 of the holding frame 35. Each of the gas springs 43 extends in a thickness (vertical) direction of the test head 12. Accordingly, when the test head 12 is horizontally located, upward restoration forces (biasing forces) of the gas springs 43 are balanced with the gravity of the test head 12. Thus, if a downward pressing force is applied to the hest head 12, the test head 12 is horizontally pushed downward by, e.g., about 31 mm to a test position against the restoration forces of the gas springs 43, which will be described below. For that reason, when the test head 12 is pivoted at, e.g., the upper position, there is a sufficient clearance between the test head 12 and the probe card 26, a reinforcement member 28, and other elements to prevent the test head 12 from interfering with them.

Each of the opposite arms 34 includes a protrusion 34a. The protrusion 34a is formed by protruding a region of the arm 34, located between the gas springs 43 in a longitudinal direction thereof toward the test head 12 in an approximate U-shape. Two guide rails 46 extending in the thickness direction of the test head 12 are provided at two positions in the reinforcement plate 42 facing the protrusion 34a and guide members 45 are provided in the protrusions 34a to guide the guide rails 46, respectively. Accordingly, when the test head 12 is horizontally located, the test head 12 is moved downward against the restoration forces of the gas springs 43 while the guide rails 46 are guided by the guide members 45. A handle 39 shown in FIG. 1 is for an operator to rotate the test head 12. In other drawings, the handle 39 may be omitted.

Through holes 47a and 47b are formed at corresponding positions of the opposite arms 34 and the reinforcement plate 42 attached to the opposite side surfaces of the test head 12, respectively. A lock pin 48, which is supported by a reciprocating mechanism (not shown) arranged in the main body 11, may pass through the through holes 47a and 47b, or may be removed from the through holes 47a and 47b as desired. When the test head 12 is pivoted, the lock pin 48 passes through the through holes 47a and 47b to lock the test head such that the test head 12 may not be slid upward or downward. However, when the test head 12 horizontally moved upward and downward, the lock pin is moved back to release the lock of the test head 12. FIG. 3 shows the arm 34 with a portion thereof cut out.

A pressing unit 36 is provided between the main body 11 and each of the opposite arms 34. The pressing unit 36 applies a biasing force to pivot the corresponding arm 34 upward. The pressing unit 36 includes a biasing rod 38 urged to extend by a gas spring. A base end portion of the biasing rod 38 is joined to a back portion of the main body 11 to be rotatable about a horizontal axis and a leading end portion of the biasing rod 38 is rotatably joined to a lower surface of a supporting member 37 provided on a lower surface of the arm 34.

Figure 4:
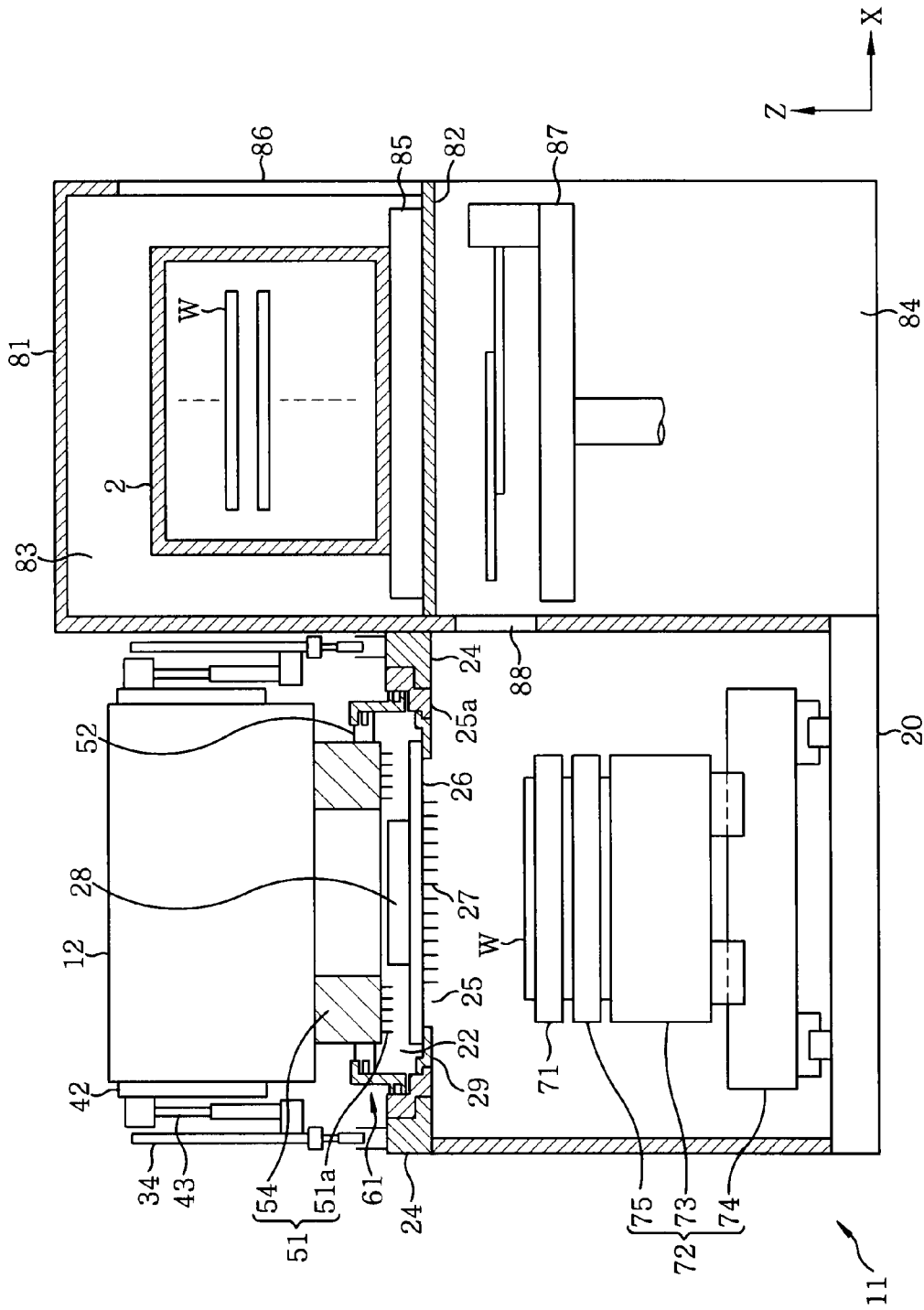
FIG. 4 is a vertically cross sectional view showing the probe apparatus shown in FIG. 1.

As shown in FIG. 4, a pogo ring 51 is provided at a lower surface of the test head 12 as an intermediate connecting member for electrically connecting the test head 12 to the probe card 26 provided to the head plate 24. The pogo ring 51 includes a ring member 54 made of an insulating material, e.g., a resin material and a plurality of pogo pins 51a protruding from a lower surface of the ring member 54. The pogo pins 51a are biased to protrude (toward the probe card 26) by springs or the like (not shown) provided at their base end portions (on the side of the test head 12).

The pogo pins 51a are arranged corresponding to electrodes formed on an upper surface of the probe card 26. Moreover, lower ends of the pogo pins 51a are spaced apart from the upper surface of the probe card 26 by, e.g., about 30 mm when the test head 12 is horizontally located after being pivoted.

Figure 5:
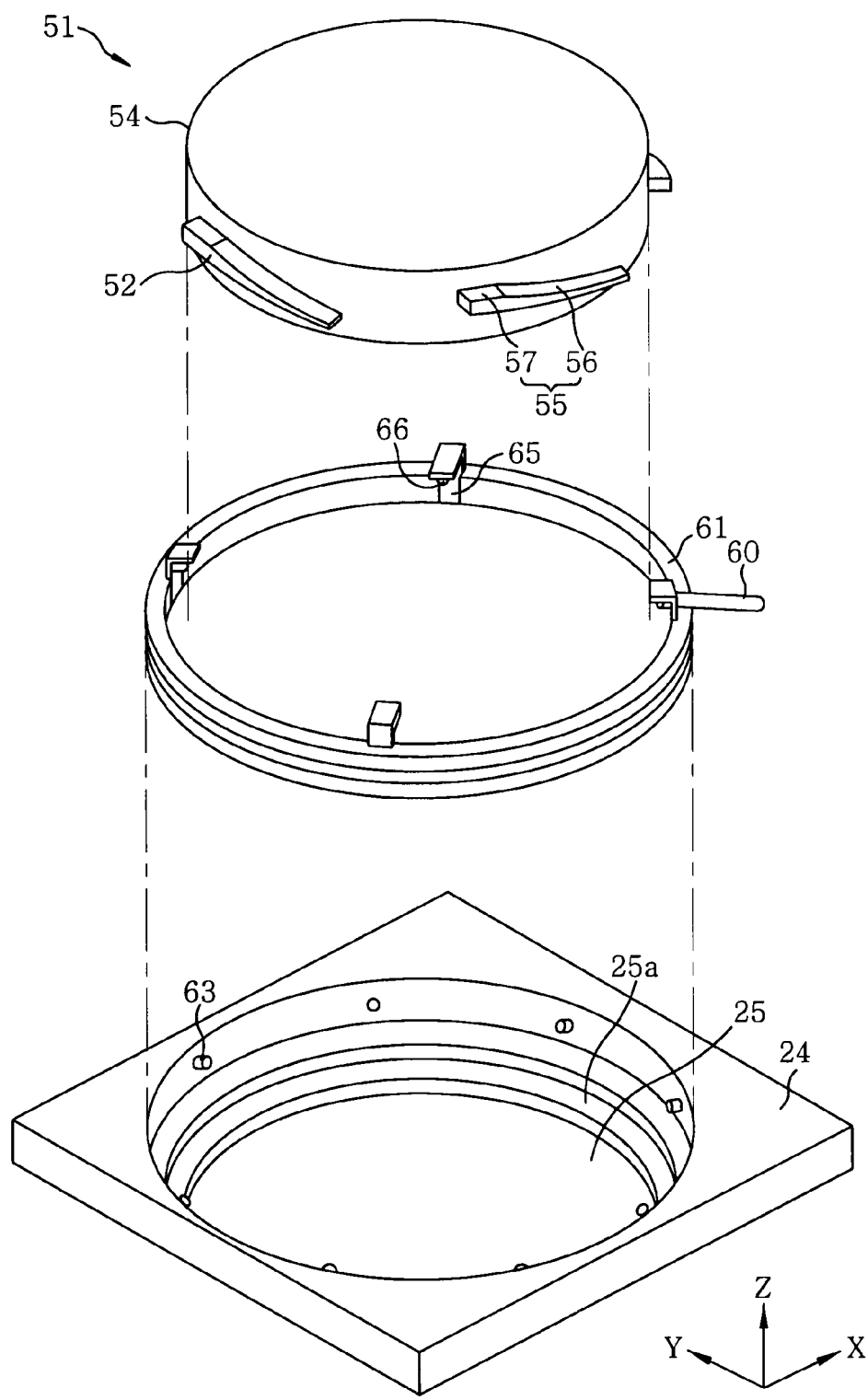
FIG. 5 is an exploded perspective view showing the head plate, a slide ring and a pogo ring provided in a lower surface of the test head shown in FIG. 3.
Figure 6A:
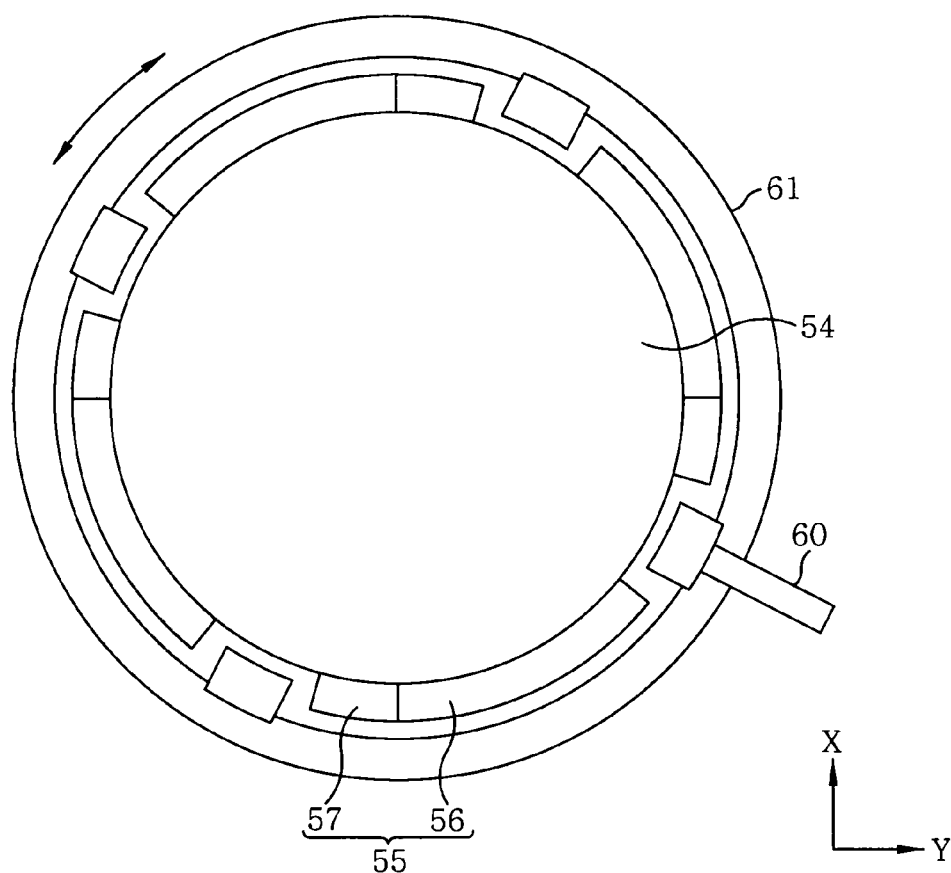
FIGS. 6A and 6B are schematic views showing the pogo ring and the slide ring shown in FIG. 5.
Figure 6B:
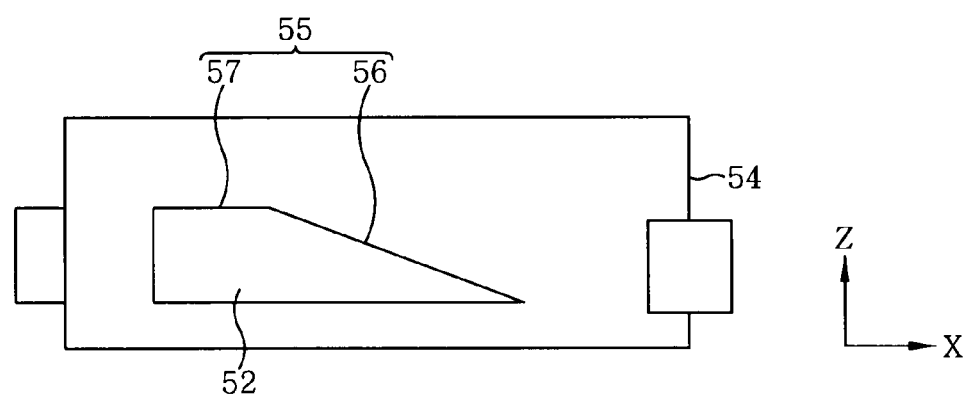

In a peripheral surface of the pogo ring 51, as shown in FIGS. 5, 6A, and 6B, a protrusion 52 outwardly protruding from the peripheral surface in a circular arc shape, i.e., along the peripheral surface of the pogo ring 51, is provided at a plurality of positions, e.g., four positions at regular intervals in a circumferential direction. Each of the protrusions 52 is formed such that an angle between opposite ends of the protrusion 52 and the center of the pogo ring 51 is about 70° when viewed from the top. An upper surface is inclined in a taper shape such that the height thereof gets higher in, e.g., a clockwise direction and serves as a guideway 55 for guiding an inner cam follower 66 to be described below. The guideway 55 includes an inclined surface 56 and a horizontal surface 57 horizontally extending from a top of the inclined surface 56 in the clockwise direction. The vertical height of the top of the inclined surface 56 is, e.g., about 33 mm.

As will be described below, the protrusion 52 cooperates with a slide ring 61 provided in the main body 11 to push downward the pogo ring 51 (the test head 12) from the horizontal position to the test position. Described below are structures of the slide ring 61 and the head plate 24.

As shown in FIGS. 4 and 5, in a center portion of the head plate 24, an opening part 25 having, e.g., a circular shape is formed to accommodate the probe card 26, the pogo ring 51 and the slide ring 61. A lower periphery portion of the opening part 25 protrudes inwardly to form a flange portion 25a. A card holder 29 is detachably joined to the flange portion 25a. The card holder 29 holds the probe card 26 having a circular shape of a diameter, e.g., 440 mm therein. FIG. 4 shows that the card holder 29 (the probe card 26) is mounted on the flange portion 25a and FIG. 5 shows that the card holder 29 is detached from the flange portion 25a.

Probes, e.g. probe needles 27 are, e.g., vertically extended from a lower surface of the probe card 26. Leading ends of the probe needles 27 are protruded downwardly to be located lower than a lower surface of the head plate 24. Each of the probe needles 27 may be of a transverse needle type. The probe needles 27 are schematically shown in FIGS. 4 and 7.

The reinforcement member 28 having a circular plate shape is provided concentrically with the probe card 26 on an upper surface of the probe card 26, for example, to prevent deformation of the probe card 26. The pogo ring 51 has an inner diameter slightly greater than an outer diameter of the reinforcement member 28 and an outer diameter slightly smaller than an outer diameter of the probe card 26.

As shown in FIGS. 5 and 6A, the slide ring 61 is provided concentrically shape with the pogo ring 51 on the flange portion 25a of the opening part 25 to accommodate the pogo ring 51 and the protrusion 52 therein. In a circumstantial vertical wall of the opening part 25, outer cam followers 63 are provided at, e.g., eight positions at regular intervals in a circumferential direction. The outer cam followers 63 are rollers that are rotatable about their horizontal axes extending toward the rotational central axis of the slide ring 61. As shown in FIG. 7, the outer cam followers 63 are fixably joined to the vertical wall by respective central shafts 63a extending along the rotational center line of the outer cam follower 63.

The slide ring 61 is rotatable about its vertical axis by the outer cam follower 63. Specifically, a ring portion 61a protrudes outwardly from an upper portion of the slide ring 61 and extends in a circumferential direction. As shown in FIG. 7, the slide ring 61 is rotatably supported by bringing the outer cam follower 63 into contact with a lower surface of the ring portion 61a. As will be described below, a fixed ring 61b protrudes outwardly from a lower portion of the slide ring 61 and extends circumferentially similarly to the ring surface portion 61a. When the test head 12 is moved downward against the biasing forces of the gas springs 43, the fixed ring 61b makes in contact with a lower side of the outer cam follower 63 to prevent the test head 12 from being moved upward, by the biasing force, from the head plate 24.

The slide ring 61 has an upper/lower two-divided structure (not shown) including an upper member having the ring portion 61a and a lower member having the fixed ring 61b. The lower member of the slide ring 61 is accommodated in the opening part 24 and then the outer cam followers 63 are joined to the vertical wall of the opening part 25. Next, the upper member is accommodated in the opening part 25. The lower member and the upper member are joined to each other by using, e.g., volts or the like.

As shown in FIGS. 5 and 7, hook portions 65 extending from a lower side of the slide ring 61 to above the slide ring 61 are provided at regular intervals in a circumferential direction at, e.g., four positions in an inner periphery of the slide ring 61 to correspond to the protrusions 52 arranged at the intervals. In an inner side of each of the hook portions 65, the inner cam follower 66 is provided at a position that is higher than that of the upper surface of the slide ring 61. The inner cam follower includes, e.g., a roller that is rotatable about a horizontal axis extending toward the rotational central axis of the slide ring 61. The inner cam follower 66 is fixably joined to the hook portion 65 by a central shaft 66a extending along the rotational center line of the inner cam follower 66. An upper portion of the hook portion 65 is bent inwardly to serve as a protection member for, e.g., preventing an operator from making in contact with the inner cam follower 66. A distance between the lower surface of the inner cam follower 66 and the upper surface of the probe card 26 is set to, e.g., about 37 mm. As will be described with reference to FIG. 17, a height h of the hook portion 65 is set to, e.g., about 54 mm. Both of the cam followers 63 and 66 are identically installed to be rotatable about their horizontal axes. However, for the easy distinguishing, the cam followers are called the inner cam follower 66 and the outer cam follower 63.

An operating lever 60, i.e., a manipulation part protrudes from an outer periphery of one of the hook portions 65 and the slide ring 61 is rotated by manipulating the operating lever 60. When the test head 12 is horizontally located with respect to the arms 34 (at the upper position), lower ends of the inclined surfaces 56 of the protrusions 52 are located lower than the lower surface of the inner cam follower 66. As will be described below, since the inner cam followers 66 are moved upward along the respective guideways 55 as the slide ring 61 is rotated, the inner cam followers 66 push downward the pogo ring 51 (the test head 12) against the biasing force to allow the test head 12 is to be at the test position. The protrusions 52 and the slide ring 61 are omitted in FIGS. 1 to 3.

As shown in FIG. 4, a mounting table 71 and a moving mechanism 72 are provided in the housing 20 of the main body 11. The mounting table 71 mounts thereon a substrate, e.g., a semiconductor wafer W, having a surface on which a plurality of target chips is arranged. The moving mechanism 72 moves the mounting table 71 in X, Y, and Z directions and rotates the mounting table 71 about its vertical axis. As shown in FIG. 4, the moving mechanism 72 includes an X-direction moving unit 73, a Y-direction moving unit 74, and a Z-direction moving unit 75. A camera (not shown) for photographing the prove needles 27 is provided in the Z-direction moving unit 75. Another camera (not shown) for photographing a surface of a wafer W is horizontally and movably installed at an upper side of the housing 20. The alignment is performed by using the cameras.

The loader unit 13 is connected to the right side of the main body 11. The loader unit 13 includes an exterior housing 81. An inner space of the housing 81 is divided into an upper space 83 and a lower space 84 by a partition wall 82. In the upper space 83, there is installed a mounting member 85 for mounting thereon a FOUP 2, i.e., a sealed transfer container in which, e.g., 25 wafers are accommodated. An opening 86 is formed at a portion of the housing 81 on the right side of the FOUP 2 and the FOUP 2 is transferred between a transfer unit (not shown) and the mounting member 85 through the opening 86.

A transfer arm 87 is provided at a front side area in the housing 81. The transfer arm 87 is rotatable about its vertical axis, vertically movable, and horizontally extensible and contractible. The transfer arm 87 transfers a wafer W between the FOUP 2 in the upper space 83 and the mounting table 71 of the main body 11 through an opening 88 formed between the main body 11 and the loader unit 13.

As shown in FIG. 2, a control device 5, e.g., a computer, is provided in the probe apparatus. The control device 5 includes a program storage unit and a data processing unit having a central processing unit (CPU) and a memory. The programs stored in the program storage unit includes various process groups for attaching and detaching the test head 12 with respect to the head plate 24, performing the transfer of a wafer W, position alignment of a wafer W, and performing a test of a wafer W. Moreover, e.g., the memory stores a moving process of the moving mechanism 72 or includes a region into which processing parameter values such as a moving amount and the like are input. Then, when the CPU executes each command of program, the parameter values are read and control signals corresponding to the parameter values are transmitted to each component of the probe apparatus. The programs (including programs related to display and input manipulation of processing parameters) are stored in a storage unit 6 such as a computer storage medium, e.g., a flexible disk, a compact disk, a magneto-optical (MO) disk, a hard disk, or the like and installed in the control device 5.

Next, a probe method using the probe apparatus in accordance with the first embodiment of the present invention will be described. Here, it is assumed that the test head 12 was pivoted upward and then a process of exchanging the probe card 26 mounted in the opening part 25 was finished. First, an operator rotates the test head 12 from a separated position shown in FIG. 8A to a horizontal position shown in FIG. 8B in which the test head 12 is horizontally located while gripping the handle 39. In the horizontal position, the protrusions 52 formed in the side peripheral surface of the pogo ring 51 are located in spaces between the adjacent inner cam followers 66, respectively. In this case, the lower ends of the inclined surfaces 56 of the protrusions 52 are located lower than the lower surfaces of the inner cam followers 66 as shown in FIG. 9.

Figure 9:
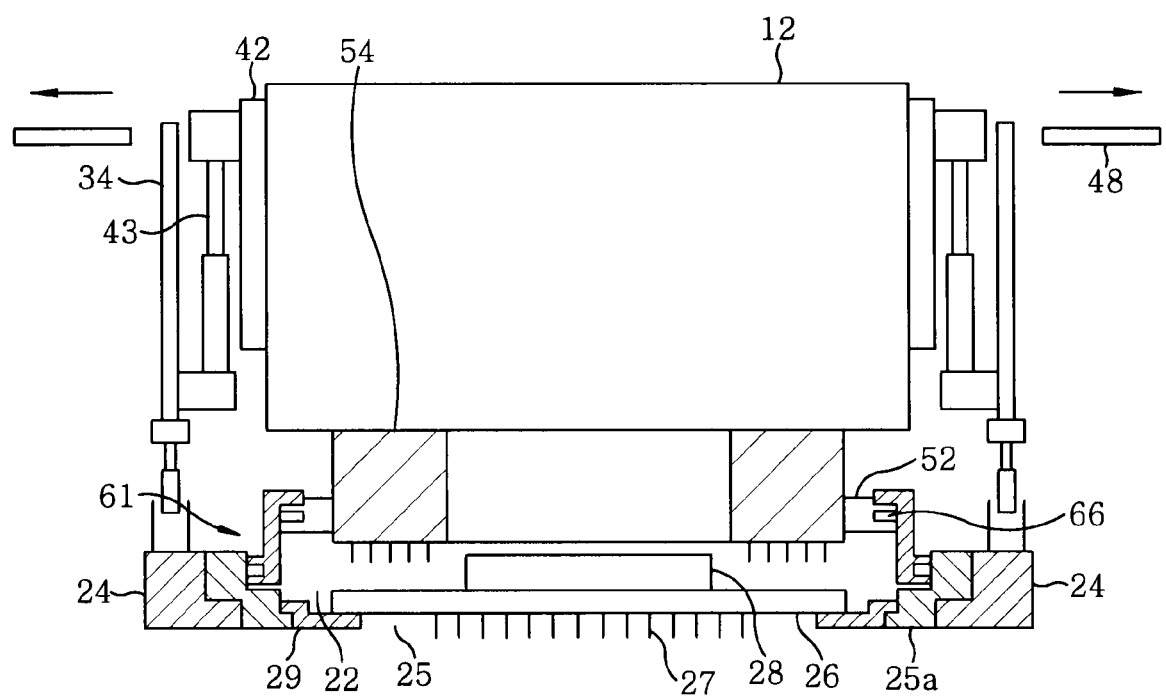
FIG. 9 shows how the probe apparatus shown in FIG. 1 is operated.
Figure 10A:
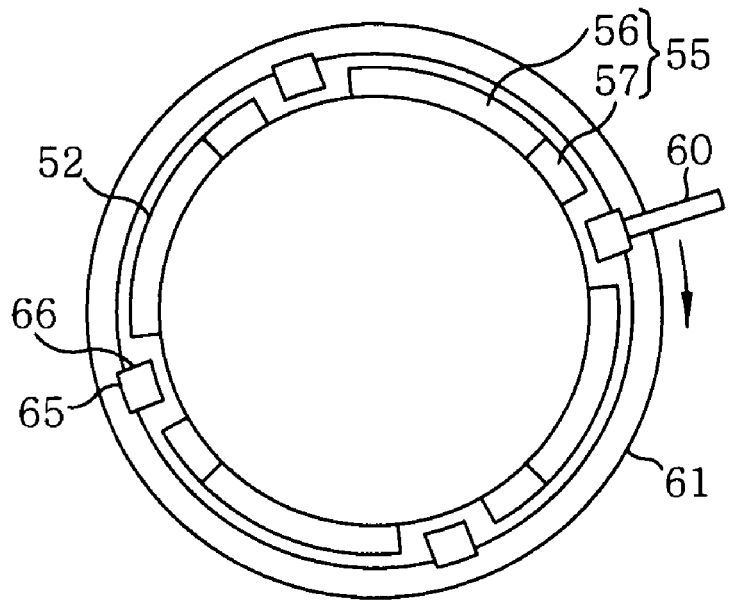
FIGS. 10A to 10C show how the probe apparatus shown in FIG. 1 is operated.
Figure 10B:
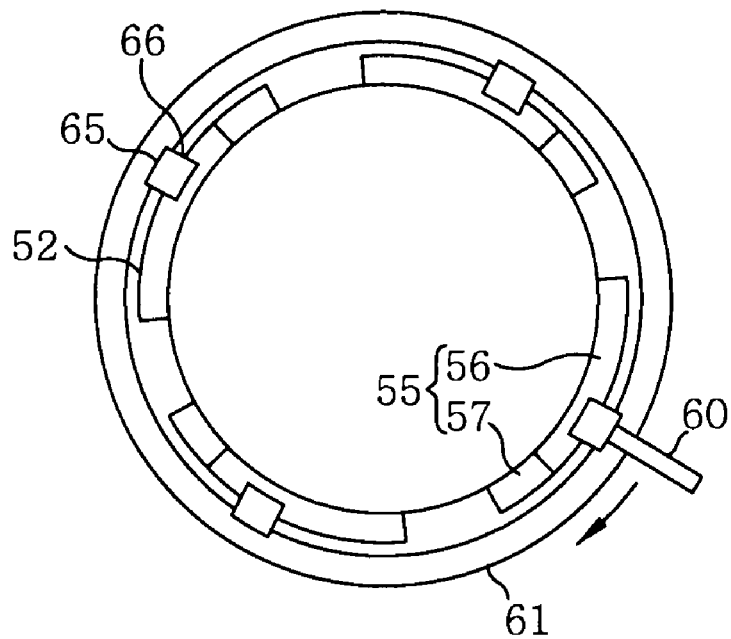
Figure 10C:
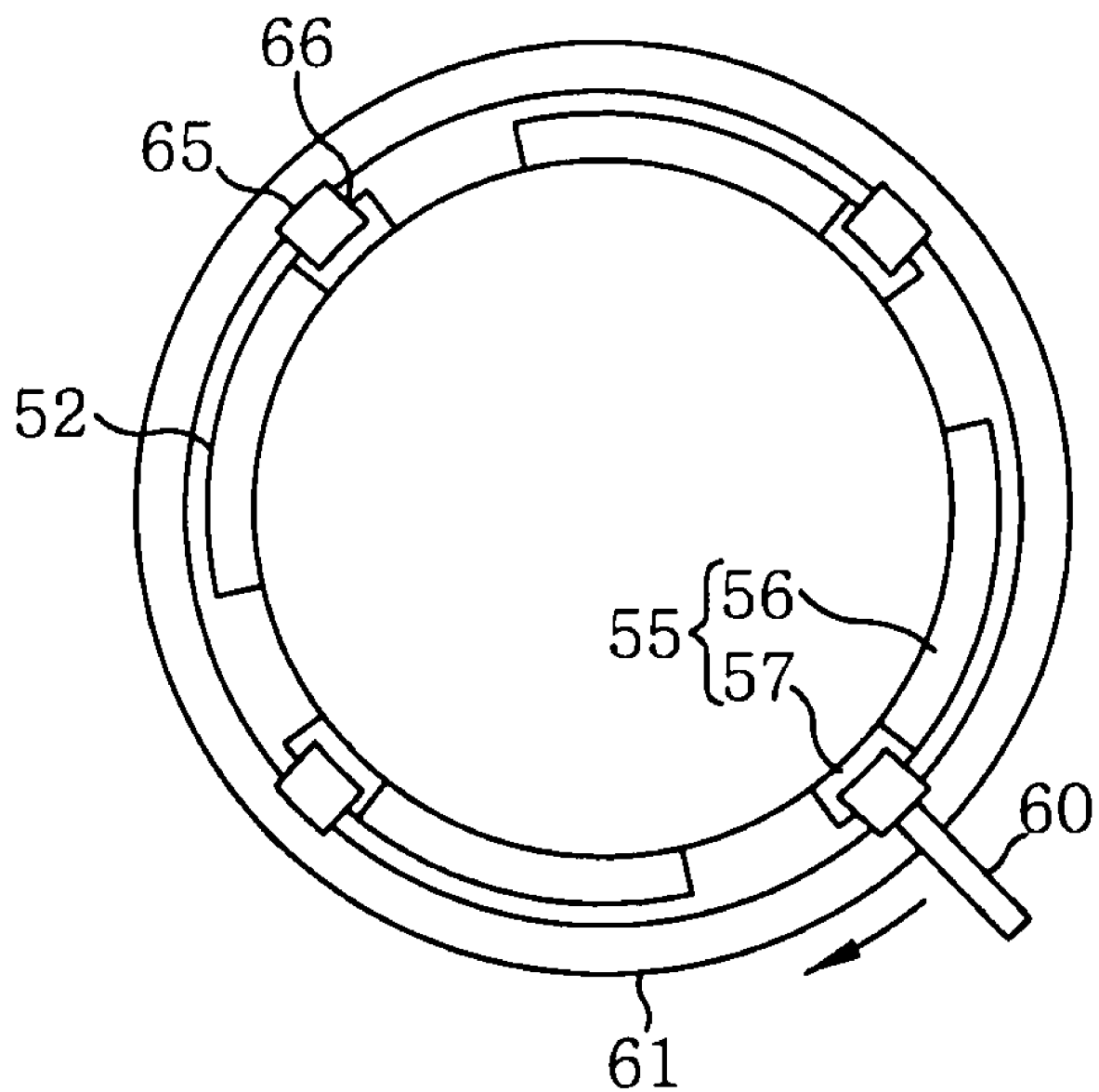
Figure 11A:
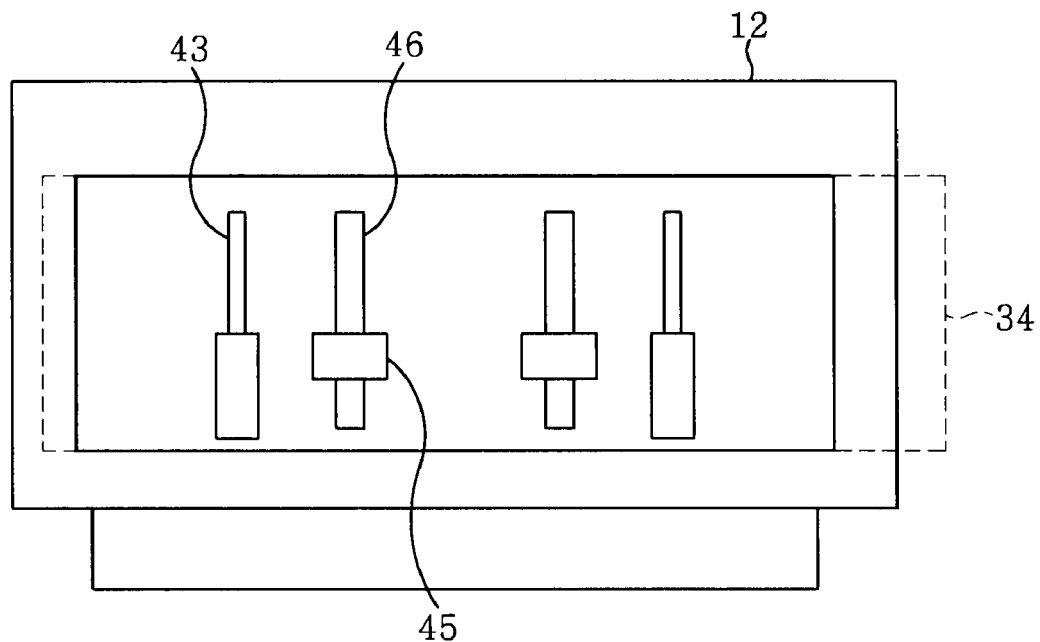
FIGS. 11A and 11B show how the probe apparatus shown in FIG. 1 is operated.
Figure 11B:
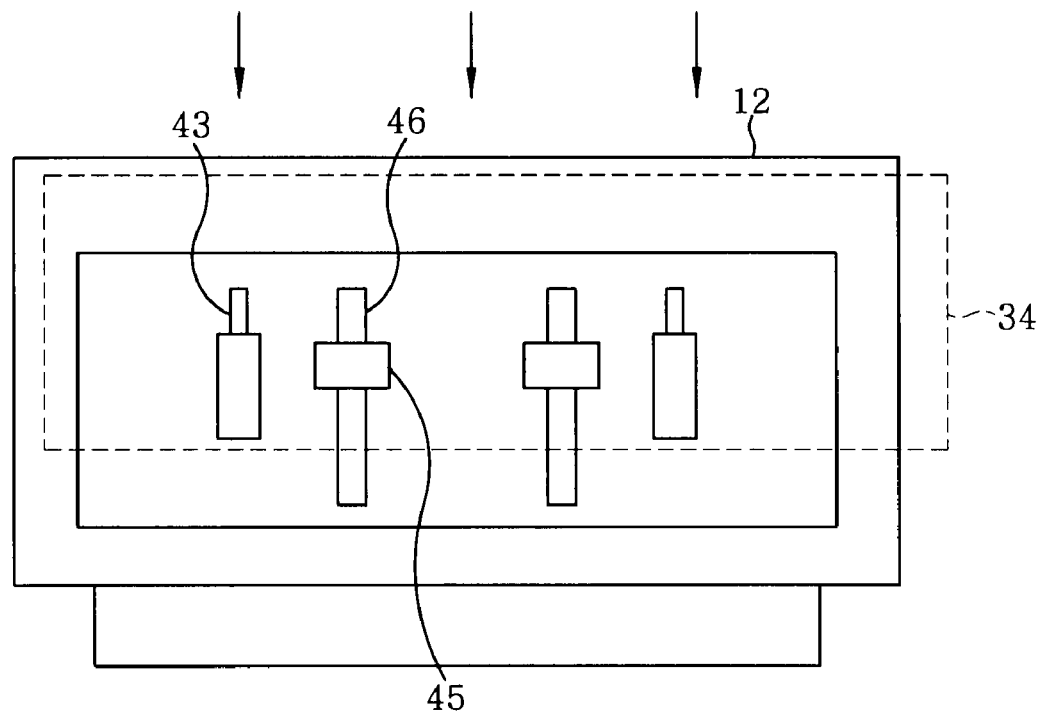

Then, the lock pin 48 is removed from the through holes 47a and 47b, thereby releasing the lock of the test head 12 as shown in FIG. 9. Thereafter, as shown in FIGS. 10A and 10B, as the operating lever 60 is rotated by an operator in a clockwise direction, the inner cam followers are respectively guided and moved upward along the inclined surfaces 56 of the guideways 55 of the protrusions 52 as described above. Accordingly, as shown in FIGS. 11A and 11B, the pogo ring 51 and the test head 12 are vertically pushed downward while the guide rails 46 are guided downward along the respective guide members 45 against the biasing force of the gas spring 43.

Figure 12A:
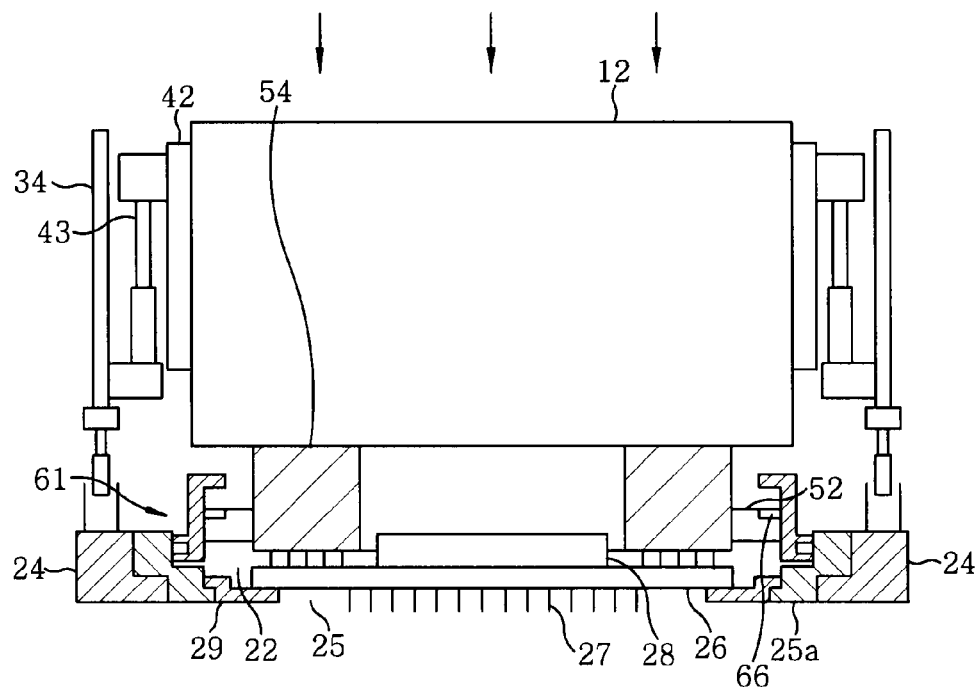
FIGS. 12A and 12B show how the probe apparatus shown in FIG. 1 is operated.
Figure 12B:
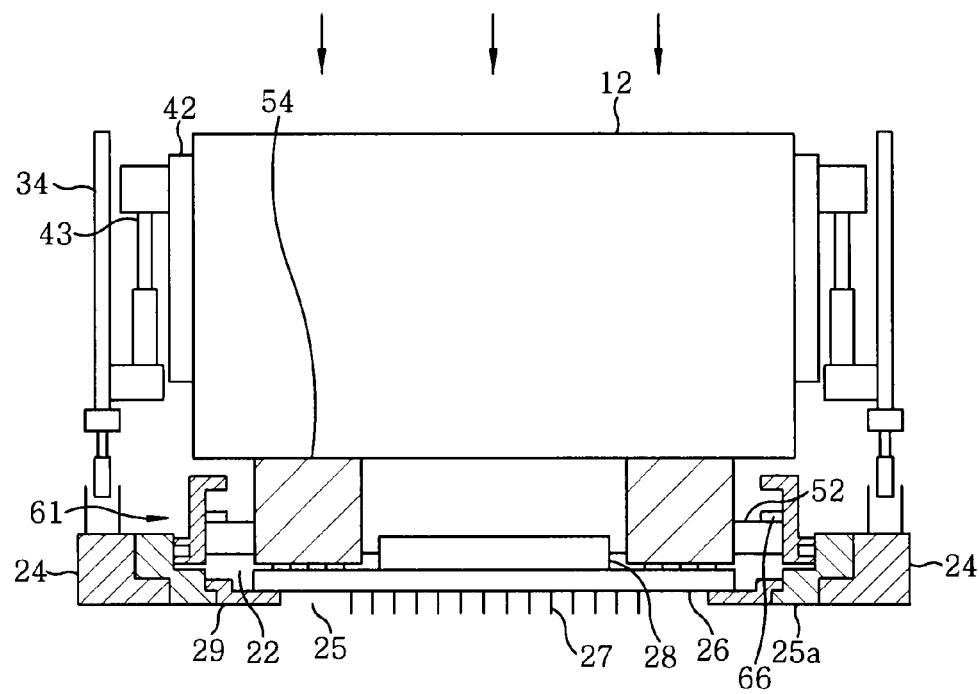

If the pogo ring 51 is pushed downward by, e.g., about 30 mm from the horizontal position shown in FIG. 9, the pogo pins 51a of the pogo ring 51 are brought into contact with the probe card 26 as shown in FIG. 12A. Then, if the operating lever 60 is rotated by about 70° from the position shown in FIG. 10A in the clockwise direction to allow the inner cam followers 66 to be bought into contact with the horizontal surfaces 57 of the guideways 55 of the protrusions 52, respectively, the pogo ring 51 is moved downward by about 1.7 mm as shown in FIG. 12B. As a result, a pressure of, e.g., about 250 kg/cm$^2$ is applied to the probe card 26 and the test head 12 is located at the test position where the pogo ring 51 are brought into complete electric-contact with the probe card 26. Moreover, since the inner cam followers 66 are respectively located on the horizontal surfaces 57 of the protrusion 52, the test head is fixably located at this level position (the test position) against the biasing forces of the gas spring 43.

Figure 13A:
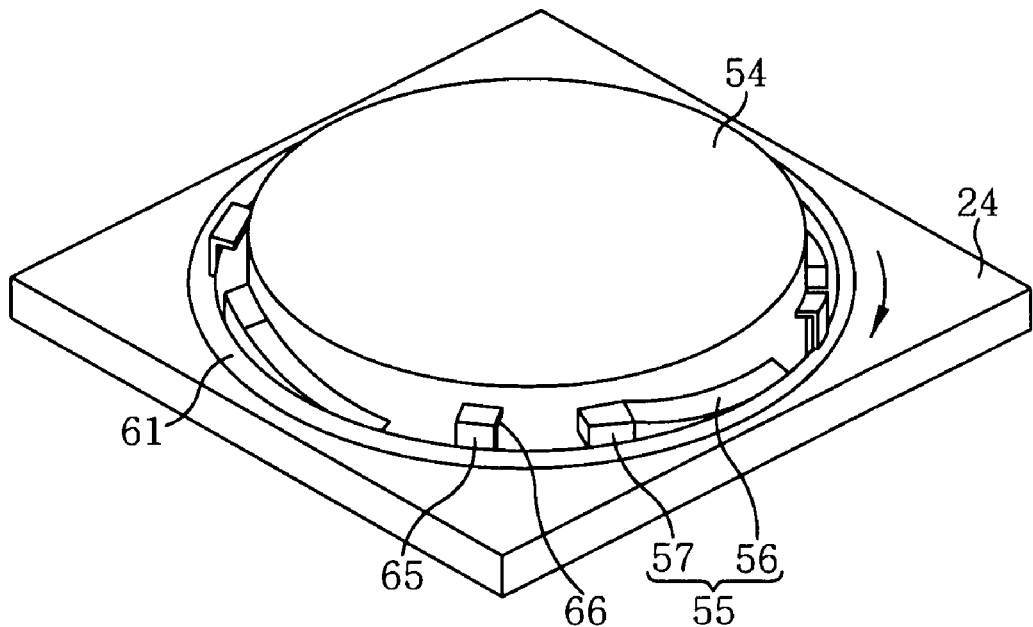
FIGS. 13A to 13C show how the probe apparatus shown in FIG. 1 is operated.
Figure 13B:
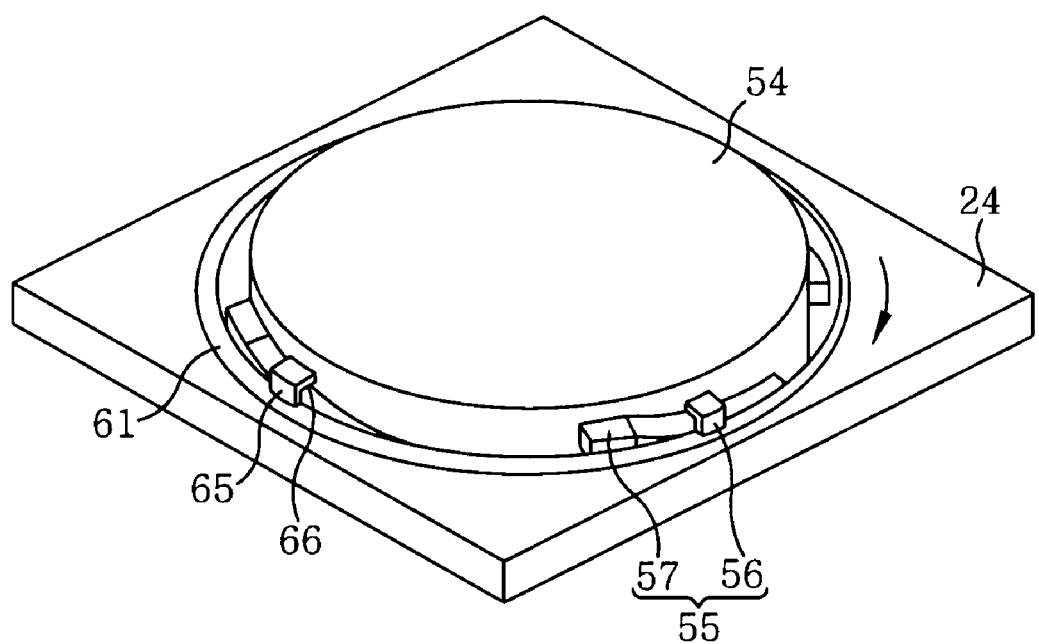
Figure 13C:
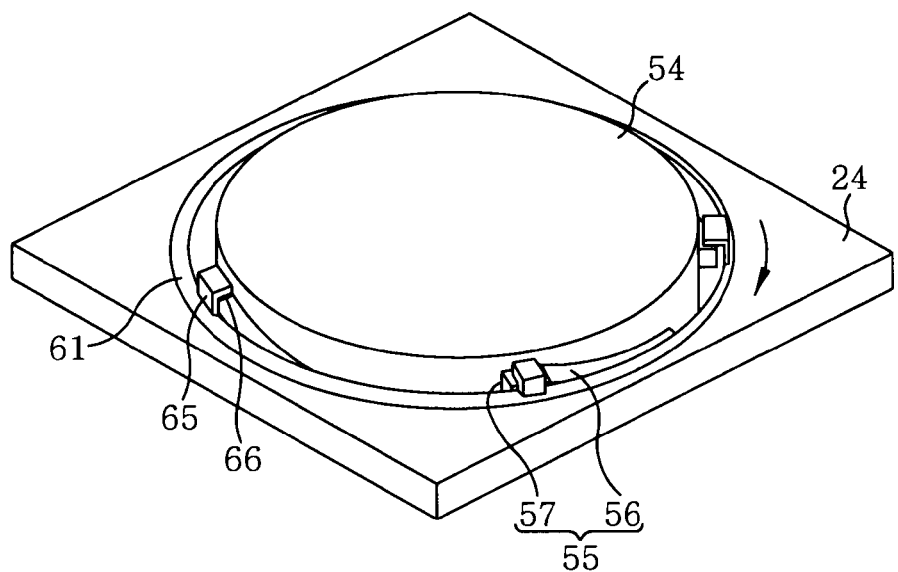
Figure 14:
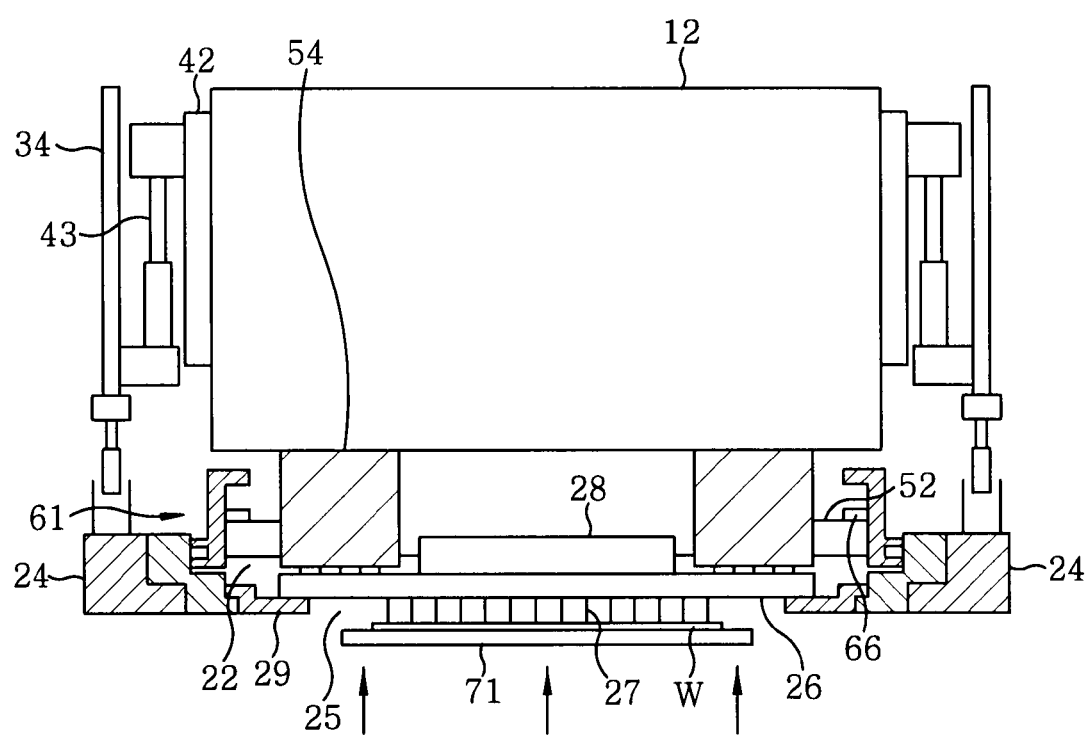
FIG. 14 shows how the probe apparatus shown in FIG. 1 is operated.

FIGS. 13A to 13C schematically show how the pogo ring 51 is pushed downward by the rotation of the slide ring 61. In detail, FIG. 13A shows that the inner cam followers 66 are located between the protrusions 52 and FIG. 13B shows that the inner cam followers 66 are moved relatively upward along the inclined surfaces 57 of the guideways 55, respectively. FIG. 13C shows that the inner cam followers 66 have arrived at the horizontal surfaces 57 of the guideways 55, respectively. As a result, the test head 12 is fixably located at the test position.

In this way, after the installation of the probe card 26 and the setting (rotation and downward movement) of the test head 12 are completed, a test for a wafer W is started. In detail, a wafer W is unloaded from the FOUP 2 on the mounting member 85 by the transfer arm 87. Then, the unloaded wafer W is mounted on the mounting table 71 in the main body 11. Next, as described above, the probe needles 27 are aligned with the wafer W and are brought into contact with electrode pads formed on target chips on the wafer W. Electrical characteristics of the target chips are tested by supplying preset electrical signals to the electrode pads via the test head 12, the pogo ring 51, the probe card 26, and the probe needles 27.

Figure 8A:
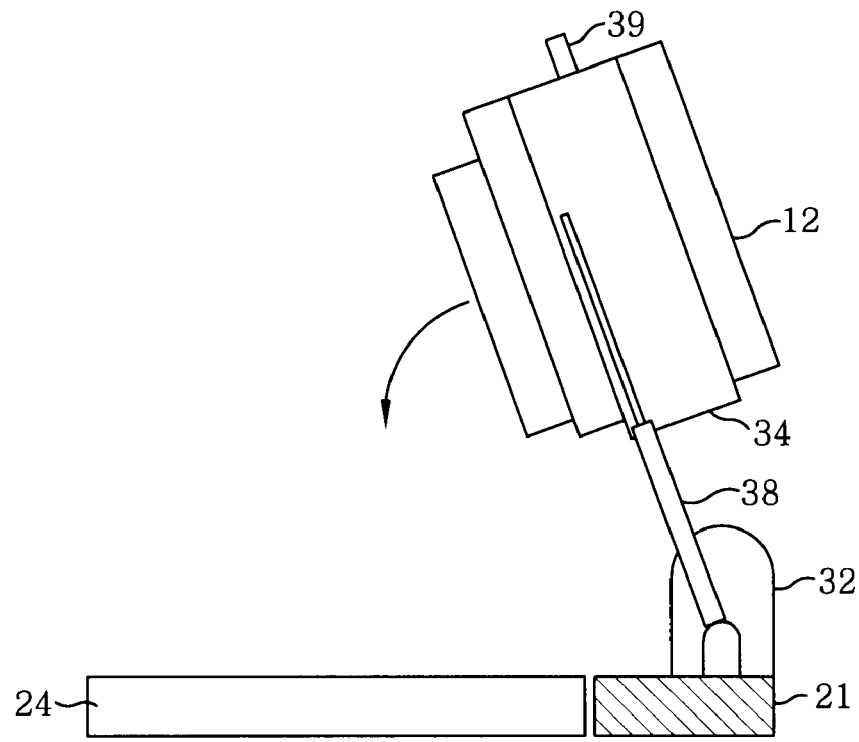
FIGS. 8A and 8B show how the probe apparatus shown in FIG. 1 is operated.
Figure 8B:
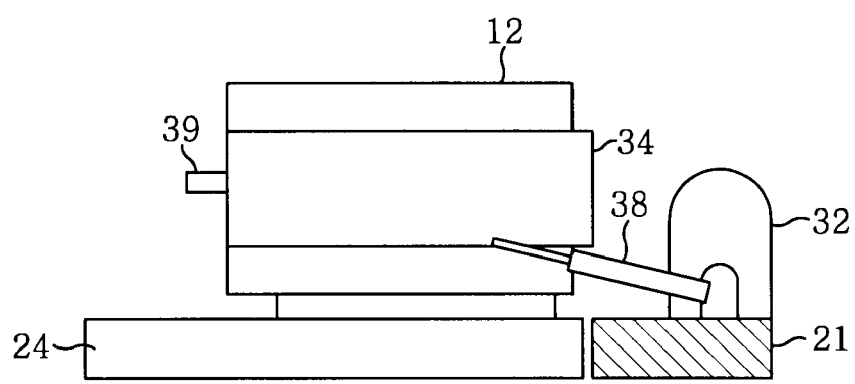

For example, when an exchange of the probe card 26, a maintenance of the test head 12, or the like is performed at the interval between lots of the wafer W, an operator rotates the operating lever 60 up to the position shown in FIG. 10A in the counterclockwise direction and pivots the test head 12 upward from the horizontal position shown in FIG. 8B to the separated position shown in FIG. 8A. Specifically, when the probe card 26 is exchanged for example, the test head 12 is pivoted upward to the separated position and then the head plate 24 is pulled out in the front direction. Thereafter, the probe card 26 is moved upward up to a height at which the probe card 26 is not interfered with the hook portions 65.

In accordance with the first embodiment of the present invention, the gas springs 43 are provided in the holding frame 35 to bias the test head 12 upwardly. Further, the test head 12 is pivoted to the horizontal position, and the protrusions 52 of the pogo ring 51 and the slide ring 61 of the head plate 24 cooperates to push down the test head 12. As a result, the angle (70°) by which the slide ring 61 is rotated, i.e., a rotated amount of the operating lever 60 may be made great relative to the vertical distance (1.7 mm) by which the test head 12 is moved downward while the pogo ring 51 and the probe card 26 are brought into contact with each other and then a pressure is applied to the probe card 26. Accordingly, it is possible to move downward the test head 12 with high accuracy. Moreover, even when it is required a great force (pressure) to push downward the pogo ring 51 against the probe card 26 since the test head 12 has a small weight or the probe card 26 has a large volume for example, it is possible to acquire reliable electrical connection by pushing the pogo ring 51 downward onto the probe card 26 by a preset pressure. In other words, the test head 12 and probe card 26 can be reliably brought into electrical contact with each other with ease.

Further, since such a mechanism for pushing downward the pogo ring 51 is simple, the cost of the mechanism is lower than the conventional mechanism for moving upward the probe card 26 by using a driving mechanism with a motor or the like. Accordingly, it is possible to inexpensively manufacture the probe apparatus.

Only that the slide ring 61 is provided around the head plate 24 to reliably bring the test head 12 into electrical contact with the probe card 26. Accordingly, when the test head 12 is pivoted to the separated position and then the probe card 26 is pulled out in the front direction to be exchanged for example, only the slide ring 61 may become an obstacle for such an exchange process. Therefore, it is possible to reduce the number of the members that may be interfered with the probe card 26. As a result, as described above, when an operator manually exchange the probe card 26, it is possible to prevent the probe card 26 and the probe needles 27 from being damaged.

In this way, since the probe card 26 can be stably exchanged by a manual work of the operator, it becomes unnecessary to use a mechanism or a device for exchanging the probe card 26. Accordingly, it is possible to inexpensively manufacture the probe apparatus and make the probe apparatus compact.

In the above first embodiment, the test head 12 is accurately vertically moved downward from the horizontal position to the test position by the protrusion 52 and the slide ring 61. Alternatively, for example, the test head 12 may be substantially vertically moved downward from the horizontal position to an approach position at which the pogo pin 51a are located near the probe card 26 and then the test head 12 is accurately vertically moved downward from the approach position to the test position by the protrusion and the slide ring 61 similarly to the aforementioned manner. This alternative example will be described below as a second embodiment of the present invention.

Figure 15:
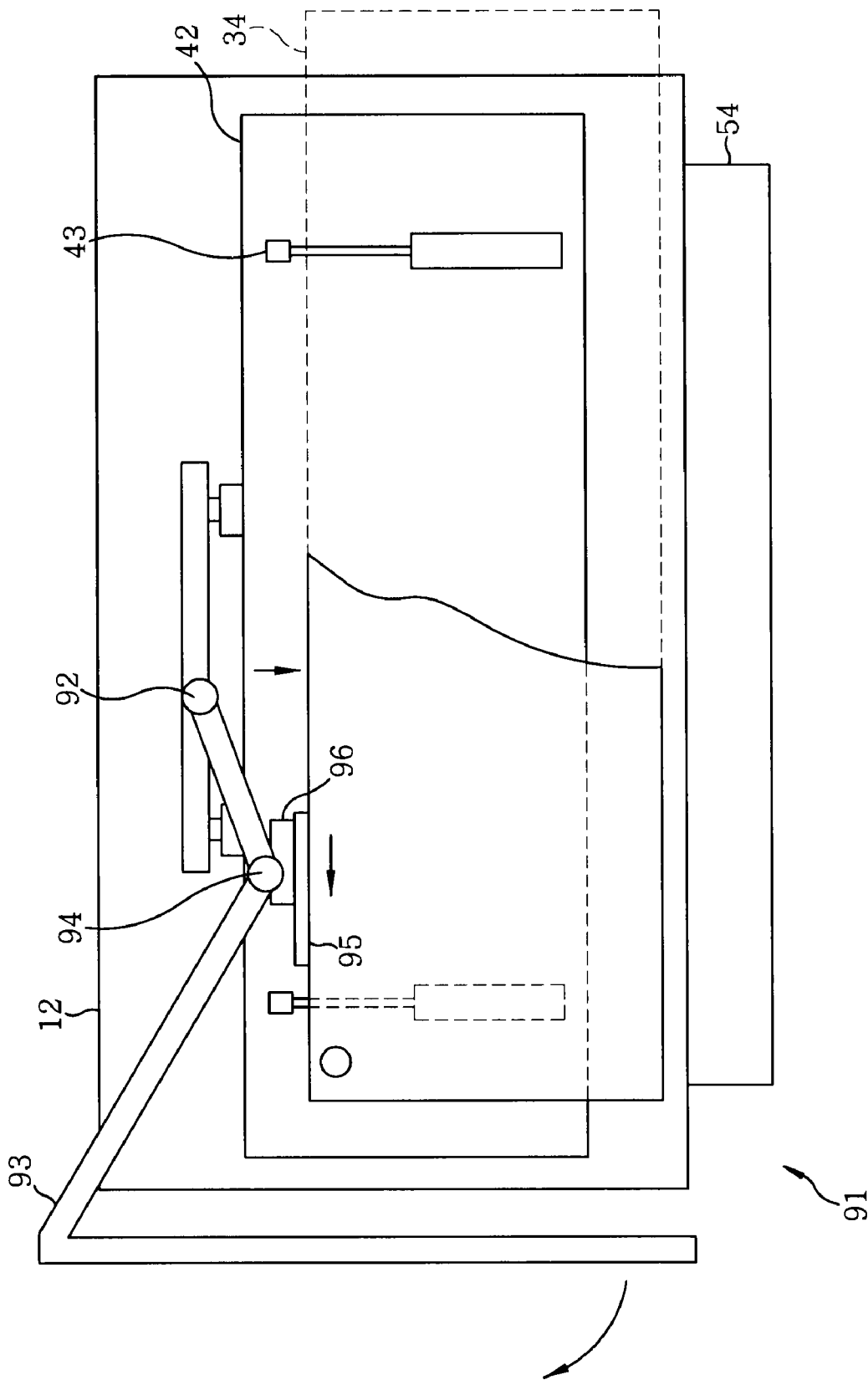
FIG. 15 is a vertically cross sectional view showing a probe apparatus in accordance with a second embodiment of the present invention.
Figure 16:
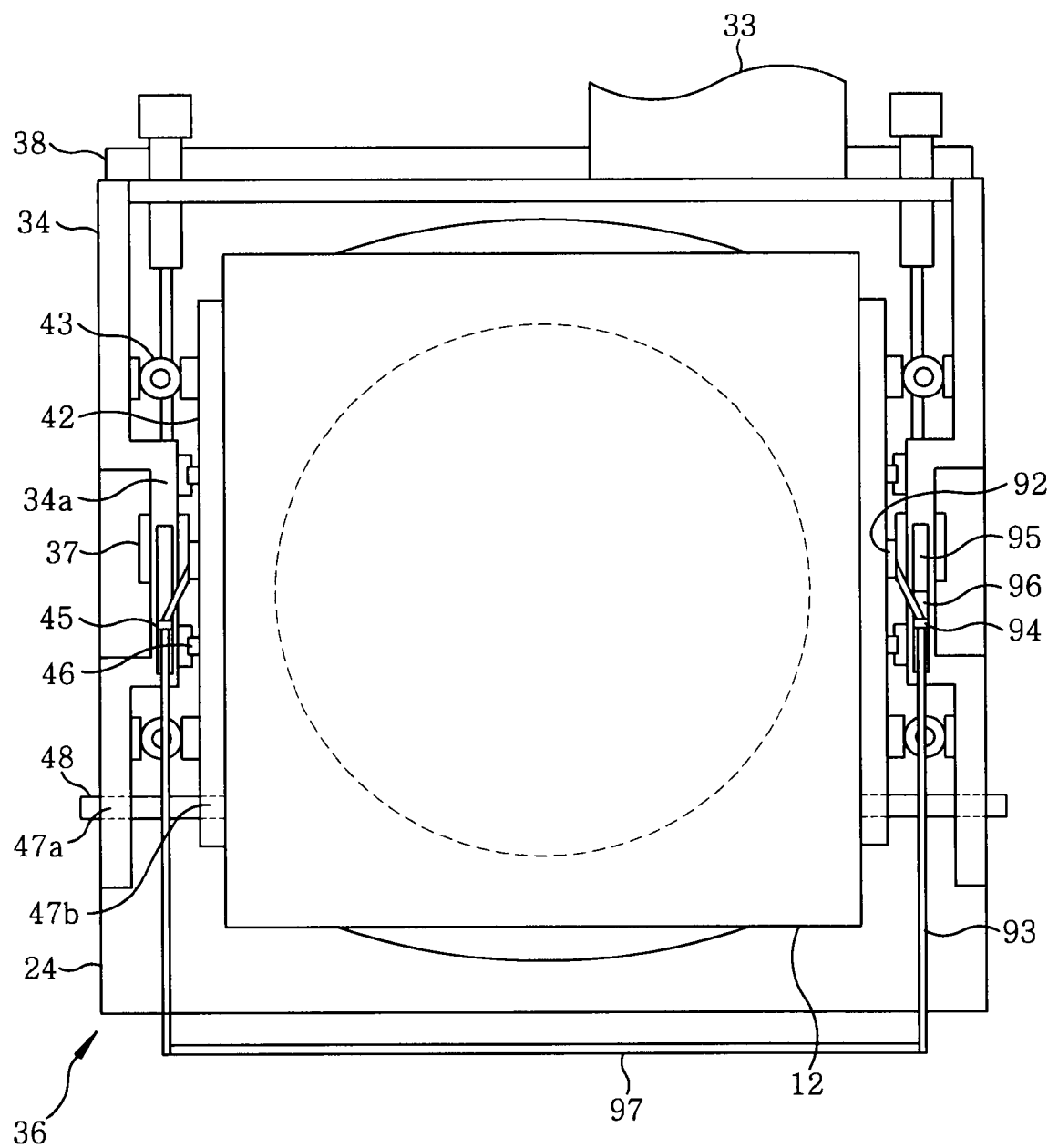
FIG. 16 is a plan view showing the probe apparatus shown FIG. 15.

As shown in FIGS. 15 and 16, a probe apparatus in accordance with the second embodiment of the present invention includes an elevating unit 91 that substantially vertically moves downward the test head 12 to the approach position at which the lower surface (pogo pins 51a) of the test head 12 is located near the upper surface of the probe card 26.

In FIG. 15, the elevating unit 91 has a substantial Z shape when the test head 12 is viewed from the side of the reinforcement plate 42. The elevating unit 91 includes a bar-shaped lever 93 and a guide 96. The bar-shaped lever 93 is rotatable in a vertical plane parallel with the reinforcement plate 42 about a horizontal rotary shaft 92 that is provided at a side surface of the test head 12, e.g., above the reinforcement plate 42. The guide 96 is joined to a bent portion 94 of the lever 93 extending from the horizontal rotary shaft 92. The guide 96 and the bent portion 94 are movable front and back along a rail 95 provided above the arm 34 in a lengthwise direction of the arm 34. A length of the lever 93 extending from the bent portion 94 in the front direction is longer than that of a portion between the horizontal rotary shaft 92 and the bent portion 94. A leading portion of the lever 93 is bent downward.

The elevating units 91 are provided at the opposite sides of the test head 12 and the levers 93 provided at the opposite sides of the test head 12 are connected to each other by an elevating shaft 97 horizontally extending on the front side of the test head 12.

The probe apparatus in accordance with the second embodiment of the present invention also includes the guide members 45, the guide rails 46, the protrusions 52, the slide ring 61, and the other elements, which are identical or similar to those included in the probe apparatus in accordance with the first embodiment of the present invention. In the second embodiment, as described above, the pogo ring 51 is moved upward by the elevating unit 91 to the approach position at which the pogo pin 51a are located near the probe card 26. Accordingly, the height at which the pogo ring 51 is vertically moved by the protrusion 52 and the slide ring 61 is reduced as compared with that in the first embodiment.

Figure 17:
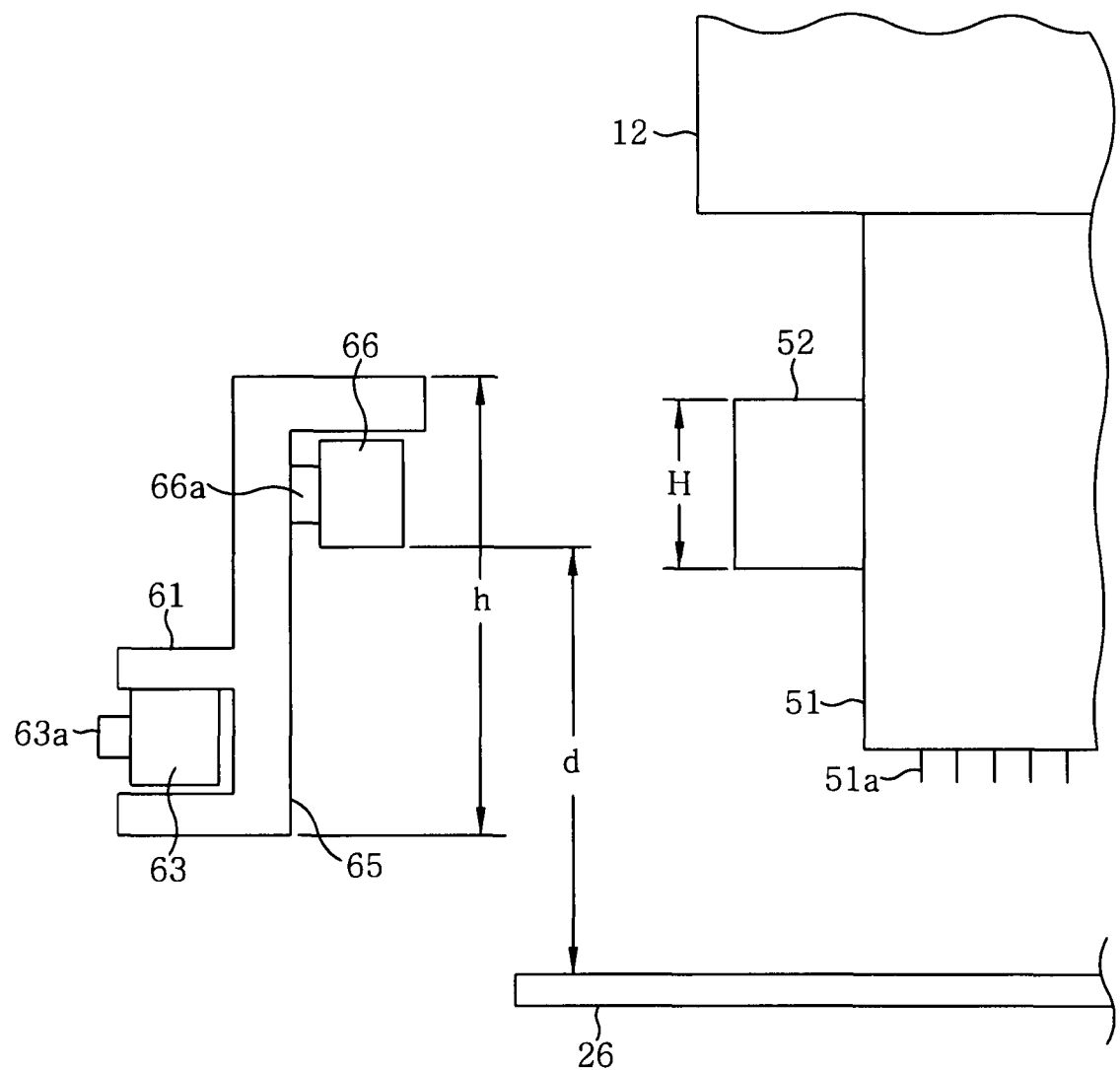
FIG. 17 is an enlarged schematic view showing a pogo ring of the probe apparatus shown in FIG. 15.

As a result, as shown in FIG. 17, a height H of the protrusion 52 and a height h of the hook portion 65 of the slide ring 61 are, e.g., about 4 mm and 35 mm, respectively. A distance d between the lower end of the inner cam follower 66 and the upper surface of the probe card 26 is about 12 mm. For the convenience, the protrusion 52 and the slide ring 65 horizontally separated from each other are shown in FIG. 17.

Figure 18A:
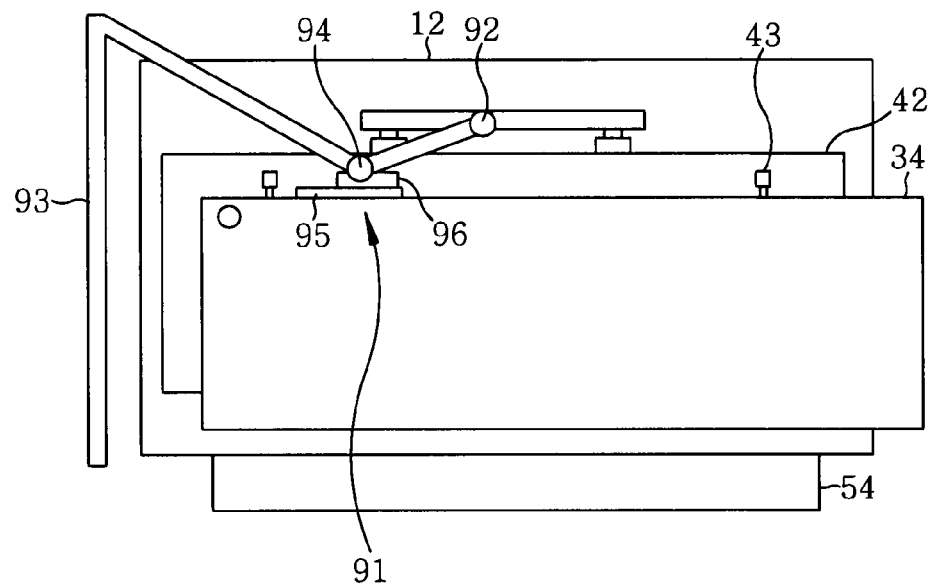
FIGS. 18A and 18B show how the probe apparatus shown in FIG. 15 is operated.
Figure 18B:
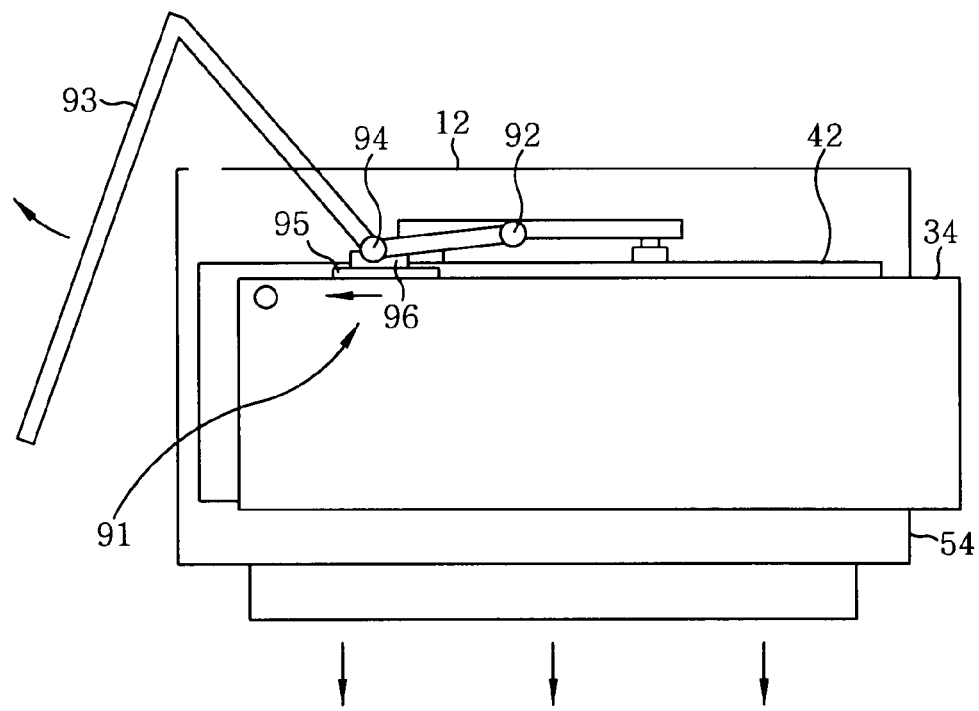

As described above, after the test head 12 is pivoted from the separated position to the horizontal position, the bent portion 94 is moved in the front direction along the rail 95 as the leading portion of the lever 93 is pulled in the front direction by an operator as shown in FIG. 18. Accordingly, the test head 12 is pushed downward by the lever rule using the bent portion 94 as a hinge point. Then, when the test head 12 is moved downward to the approach position at which the pogo pin 51a are located near the probe card 26, e.g., the pogo pins 51a are separated from the probe card 26 by about 2 mm, the lower ends of the inner cam followers 66 are located higher than the lower ends of the inclined surfaces 56 of the protrusions 52. Thereafter, as described in the first embodiment, the protrusions 52 and the slide ring 61 cooperate to move downward the test head 12 to the test position at which the test head 12 is brought into electrical contact with the probe card 26.

As such, even though the test head 12 is substantially vertically moved downward by the elevating unit 91, the test head 12 is accurately vertically moved downward by the protrusions 52 and the slide ring 61 when the test head 12 is brought into contact with the probe card 26. Accordingly, for example, the pogo pins 51*a* may not slide on the probe card 26 or there may occur no position deviation.

As a result, the same effect as in the first embodiment can be obtained in the second embodiment. Moreover, the height H of the protrusion 52 and the height h of the hook portion 65 of the slide ring 61 can be smaller than those in the first embodiment. Accordingly, for example, when the operator pulls out the head plate 24 in the front direction to exchange the probe card 26, since the upper end of the hook portion 65 is not significantly separated from the upper surface of the probe card 26, a height at which the probe card 26 is moved upward by the operator can be shortened when the probe card 26 is moved upward from the head plate 24,. Therefore, since it is difficult that the probe card 26 and the probe needles 27 are interfered with the hook portion 65, it is possible to more efficiently prevent the probe card 26 and the probe needle 27 from being damaged as compared with the first embodiment.

Figure 20:
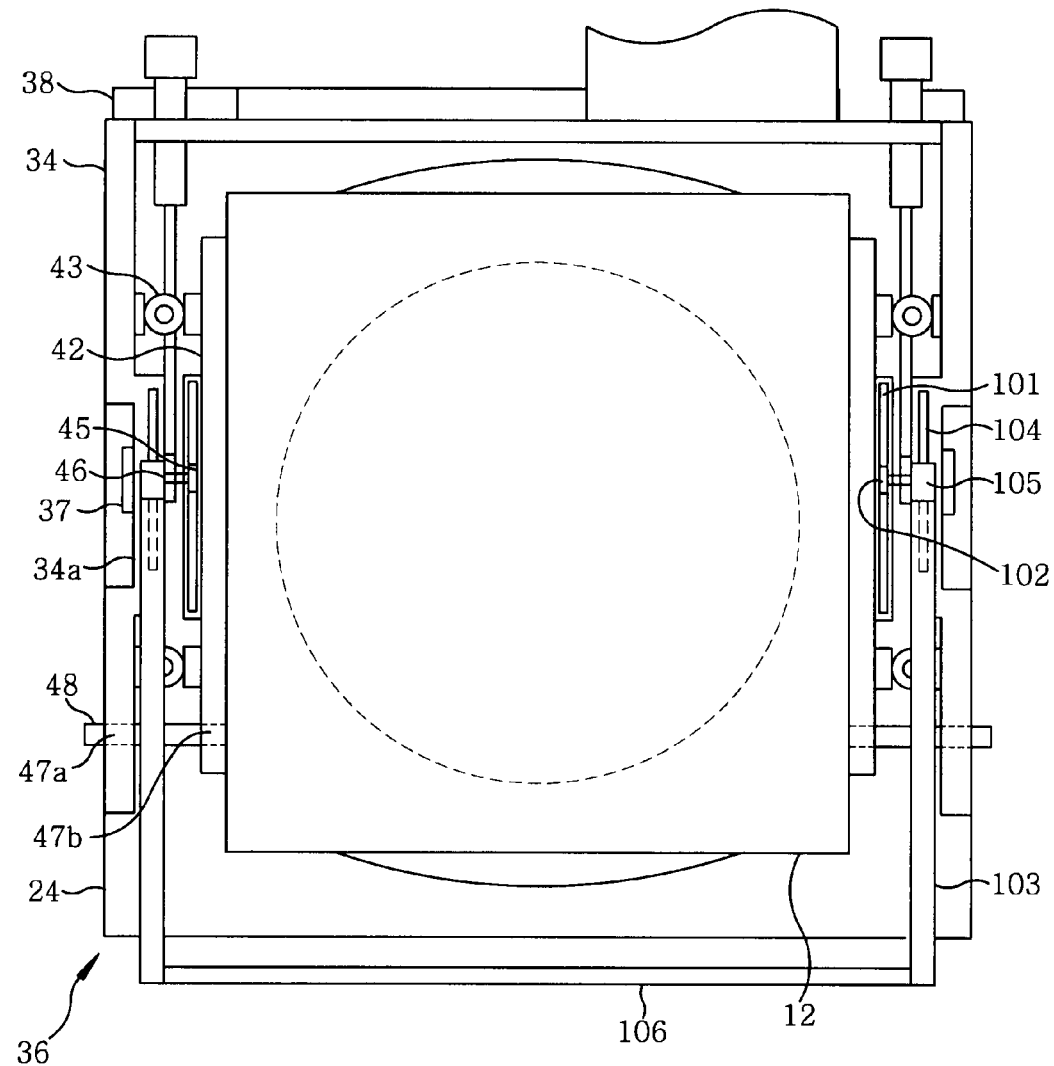
FIG. 20 is a plan view showing the probe apparatus shown in FIG. 19.

Alternatively, an elevating unit 191 having, e.g., a configuration shown in FIGS. 19 and 20 may be used instead of the elevating unit 91. In this case, a rail 101 is joined to a side surface of the reinforcement plate 42 and a wheel 102 is provided on the rail 101 to be movable along the rail 101. The rail 102 is inclined such that its height is increased from the front side toward the back side. One end of a lever 103 having, e.g., a bar shape is rotatably connected to a rotation shaft (not shown) of the wheel 102 and the lever 103 extends through a guide 105 and then is bent to extend horizontally toward the front side. The guide 105 is fitted with a fitting rail 104 to be movable front and back along the fitting rail 104. The fitting rail 104 is provided on the arm 34 in parallel with the rail 101. As such, the elevating unit 191 includes the rails 101 and 104, the wheel 102, the lever 103, and the guide 105. The elevating units 191 are provided at the opposite sides of the text head 12 and the levers 103 provided at the opposite sides of the test head 12 are connected to each other by an elevating shaft 106 horizontally extending on the front side of the test head 12. In this example, the guide member 45 and the guide rail 46, which are not shown, are provided between the rail 101 and the gas spring 43.

Figure 21A:
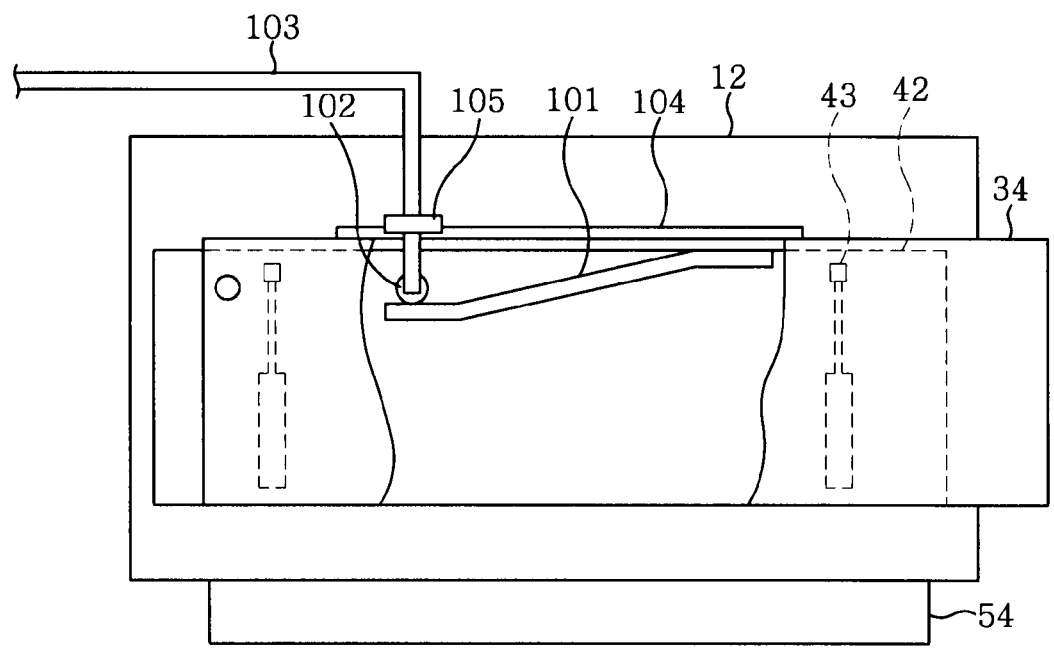
FIGS. 21A and 21B are enlarged schematic views showing a pogo ring of the probe apparatus shown in FIG. 19.
Figure 21B:
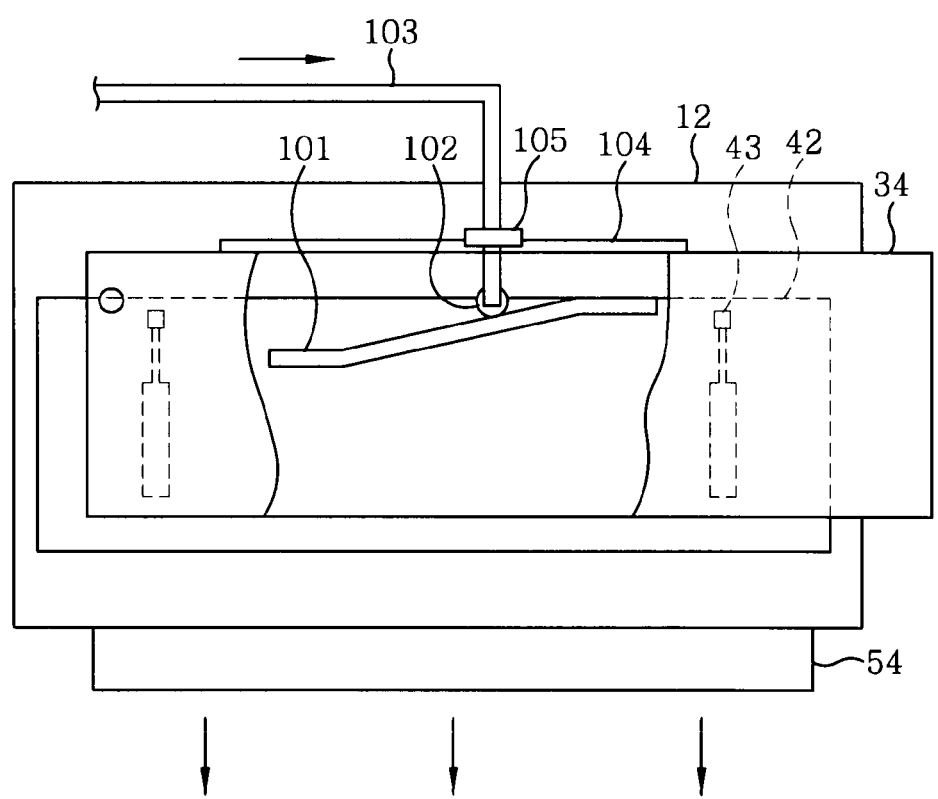

As shown in FIGS. 21A and 21B, as the lever 103 is horizontally pushed in the back direction, since the guide 105 is being fitted with the fitting rail 104, the wheel 103 is moved relatively upward along the rail 101 while the upward movement of the lever 103 is suppressed. As a result, in the arm 34, the test head 12 (the pogo pin 51*a*) is pushed downward to the approach position at which the pogo pin 51*a* are located near the probe card 26. Thereafter, similarly to the second embodiment shown in FIGS. 15 and 16, the protrusions 52 and the slide ring 61 cooperate to move downward the text head 12 to the test position, thereby testing the wafer W. It is also possible to obtain the same effect as those in the second embodiment.

Figure 22:
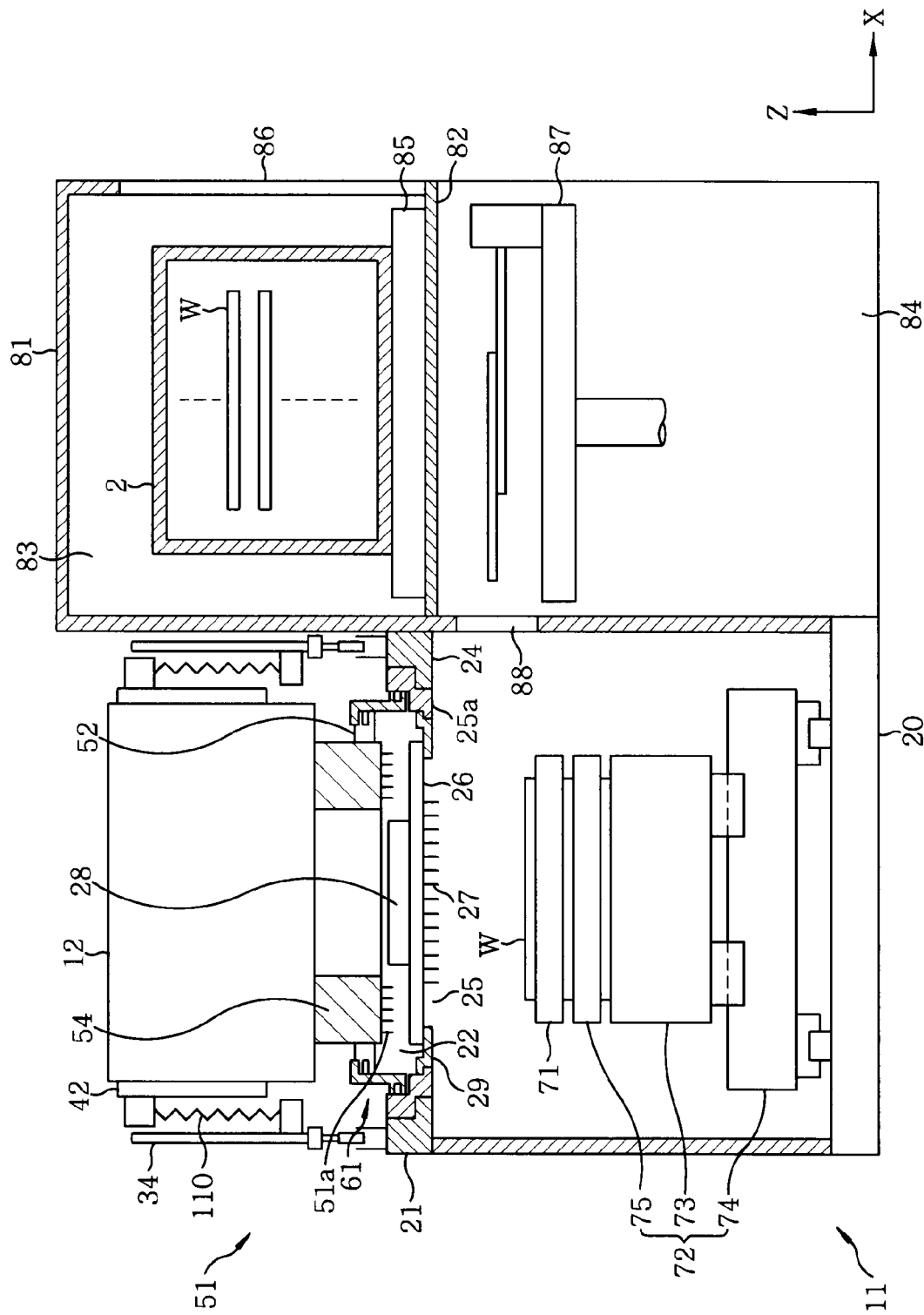
FIG. 22 is a vertically cross sectional view showing a probe apparatus in accordance with a fourth embodiment of the present invention.

As described above, as the mechanism for biasing the test head 12 upward to support it in the arm 43, e.g., springs 110 may be employed as shown in FIG. 22 instead of the gas springs 43. The embodiments of the present invention are applied to the probe apparatus employing the lightweight test head 12 having about 60 kg or less, and the pressure applied to the probe card 26 being 250 kg/cm$^2$ or less when the test head 12 mounted on the probe card 26. However, the present invention may be applied to a probe apparatus employing a test head 12 having a weight of 600 to 700 kg or more. In this case, it is also possible to accurately vertically move downward the test head 12. Moreover, since the elevating unit of the test head 12 is also simple, it is possible to inexpensively manufacture the probe apparatus.

Although not illustrated, in the aforementioned embodiments, a power supply unit is located near the back side of the probe apparatus. The power supply unit extends from the bottom surface of the probe apparatus to a position that is higher than the upper surface of the test head 12. The test head 12 includes a cooling unit (not shown) for circulating air therein from the back side (the side of the hinge mechanism 32) to the front side (the side of the handle 39) to cool inner components by using the air. Accordingly, even while the test head 12 is moved upward to the separated position for example, the air flowing out from the inside of test head 12 may not remain in a space between the power supply unit and the head plate 24, in which the hinge mechanism 32 and the rotation arm 33 are provided.

Further, even though four protrusions 52 and four inner cam followers 66 are provided in the above embodiments, the number of the protrusions 52 and the inner cam followers 66 may be two, three, or five or more. Moreover, a single probe apparatus is described in the above embodiments. However, the probe apparatus may be provided in a plural number. For example, two probe apparatuses may be adjacently provided.

In accordance with the embodiments of the present invention, a biasing unit for biasing the test head is provided in the holding frame and after the test head is pivoted upward to the horizontal position, the protrusions of the test head and the slide ring of the probe card cooperate to push downward the test head. As a result, the angle by which the slide ring is rotated, i.e., a rotated amount of the operating lever can be made great relative to the vertical distance by which the test head is moved downward while the pogo ring are brought into contact with the probe card and then a pressure is applied to the probe card. Accordingly, it is possible to move downward the test head with high accuracy. Moreover, ever when it is required a great force (pressure) to push downward the pogo ring against the probe card since the test head has a small weight or the probe card has a large volume for example, it is possible to acquire reliable electrical connection by pushing the pogo ring downward onto the probe card by a preset pressure. In other words, the test head and the probe card can be simply brought into electrical contact with each other.

Further, since such a mechanism for pushing downward the pogo ring is simple, the cost of the mechanism is lower than the conventional mechanism for moving upward the probe card by using a driving device including a motor or the like. Accordingly, it is possible to inexpensively manufacture the probe apparatus.

While the invention has been shown and described with respect to the embodiments, it will be understood by those skilled in the art that various changes and modification may be made without departing from the scope of the invention as defined in the following claims.

What is claimed is:

1. A probe apparatus for testing electrical characteristics of a target chip of a substrate by bringing probes formed on a lower surface of a probe card into contact with electrical pads of the target chip, in which the probe card is mounted in an opening formed in a ceiling plate of a main body of the apparatus and a test head is arranged above the probe card, the apparatus comprising: a pivot mechanism for pivoting the test head, about its horizontal rotary shaft, between a horizontal position at which a lower surface of the test head is horizontally located above the probe card and a separated position at which the test head is separated from the ceiling plate of the main body; a holding frame connected to the rotary shaft and holding the test head through a biasing unit biasing the test head when the test head is horizontally located; an annular member rotatably mounted in a peripheral portion of the opening in its circumferential direction; cam followers provided at the annular member along its circumferential direction to be rotatable about their horizontal axes extending toward a rotational center of the annular member; an intermediate connecting member provided in a lower surface of the test head, for bringing the test head into electrical contact with an upper surface of the probe card; and protrusions provided corresponding to the cam followers at an outer periphery of the intermediate connecting member in its circumferential direction, the protrusions serving as guideways for guiding the cam followers when the test head is horizontally located, upper surfaces of the protrusions being inclined along a circle concentric with the annular member, wherein the cam followers are moved relatively upward along the respective inclined surfaces of the guideways by rotating the annular member so that the intermediate connecting member is pushed downward against a biasing force of the biasing unit to bring the test head into press-contact with the probe card.

2. The apparatus of claim 1, wherein, each of the protrusions have a horizontal surface where the cam follower is stopped when the intermediate connecting member is pushed downward, the horizontal surface extending from an upper end of the inclined surface of each of the protrusions along the concentric circle.

3. The apparatus of claim 2, wherein the cam followers are located at a position that is lower than the guideways when the test head is pivoted and horizontally located, and further comprising
an elevating unit for moving downward the test head against the biasing force of the biasing unit to a position at which the cam followers correspond to the guideways after the test head is pivoted and horizontally located.

4. The apparatus of claim 2, wherein the annular member includes an operation unit used by an operator to rotate the annular member.

5. The apparatus of claim 2, wherein the intermediate connecting member includes a ring member and a plurality of pogo pins protruding from a lower surface of the ring member, the pogo pins corresponding to electrodes of the probe card.

6. The apparatus of claim 1, wherein the cam followers are located at a position that is lower than the guideways when the test head is pivoted and horizontally located, and further comprising:
an elevating unit for moving downward the test head against the biasing force of the biasing unit to a position at which the cam followers correspond to the guideways after the test head is pivoted and horizontally located.

7. The apparatus of claim 6, wherein the annular member includes an operation unit used by an operator to rotate the annular member.

8. The apparatus of claim 6, wherein the intermediate connecting member includes a ring member and a plurality of pogo pins protruding from a lower surface of the ring member, the pogo pins corresponding to electrodes of the probe card.

9. The apparatus of claim 1, wherein the annular member includes an operation unit used by an operator to rotate the annular member.

10. The apparatus of claim 9, wherein the intermediate connecting member includes a ring member and a plurality of pogo pins protruding from a lower surface of the ring member, the pogo pins corresponding to electrodes of the probe card.

11. The apparatus of claim 1, wherein the intermediate connecting member includes a ring member and a plurality of pogo pins protruding from a lower surface of the ring member, the pogo pins corresponding to electrodes of the probe card.

* * * * *